(12) United States Patent
Tanzawa

(10) Patent No.: US 11,887,675 B2
(45) Date of Patent: Jan. 30, 2024

(54) RANDOM TELEGRAPH SIGNAL NOISE REDUCTION SCHEME FOR SEMICONDUCTOR MEMORIES

(71) Applicant: Micron Technology, Inc., Boise, ID (US)

(72) Inventor: Toru Tanzawa, Tokyo (JP)

( * ) Notice: Subject to any disclaimer, the term of this patent is extended or adjusted under 35 U.S.C. 154(b) by 0 days.

(21) Appl. No.: 17/936,445

(22) Filed: Sep. 29, 2022

(65) Prior Publication Data
US 2023/0015491 A1 Jan. 19, 2023

Related U.S. Application Data

(60) Continuation of application No. 17/245,275, filed on Apr. 30, 2021, now Pat. No. 11,462,277, which is a continuation of application No. 16/700,641, filed on Dec. 2, 2019, now Pat. No. 10,998,054, which is a continuation of application No. 16/141,717, filed on Sep. 25, 2018, now Pat. No. 10,510,420, which is a continuation of application No. 15/673,218, filed on Aug. 9, 2017, now Pat. No. 10,102,914, which is a continuation of application No. 14/997,278, filed on
(Continued)

(51) Int. Cl.
| | | |
|---|---|---|
| G11C 16/26 | (2006.01) | |
| G11C 16/12 | (2006.01) | |
| G11C 16/10 | (2006.01) | |
| G11C 7/00 | (2006.01) | |
| G11C 16/04 | (2006.01) | |
| G11C 16/34 | (2006.01) | |

(52) U.S. Cl.
CPC ............... *G11C 16/26* (2013.01); *G11C 7/00* (2013.01); *G11C 16/0408* (2013.01); *G11C 16/10* (2013.01); *G11C 16/12* (2013.01); *G11C 16/3459* (2013.01)

(58) Field of Classification Search
CPC ..... G11C 16/26; G11C 16/10; G11C 16/3459; G11C 16/12; G11C 16/0408; G11C 7/00
USPC ......................................... 365/185.19, 185.24
See application file for complete search history.

(56) References Cited

U.S. PATENT DOCUMENTS

| | | |
|---|---|---|
| 3,786,437 A | 1/1974 | Croxon et al. |
| 3,836,894 A | 9/1974 | Cricchi |
| (Continued) | | |

FOREIGN PATENT DOCUMENTS

| | | | | |
|---|---|---|---|---|
| GB | 2264578 A | * | 9/1993 | ............ G11C 16/10 |
| JP | 6249504 B1 | * | 12/2017 | ......... G11C 16/0483 |

OTHER PUBLICATIONS

Liu, Duo, Write-Activity-Aware NAND Flash Memory Management for PCM-based Embedded Systems, 2012, Hong Kong Polytechnic University (Hong Kong). All pages. (Year: 2012).*
(Continued)

*Primary Examiner* — Michael T Tran
(74) *Attorney, Agent, or Firm* — Fletcher Yoder, P.C.

(57) ABSTRACT

Embodiments are provided that include a memory device having a memory array including a plurality of access lines and data lines. The memory device further includes a circuit coupled to the plurality of access lines and configured to provide consecutive pulses to a selected one of the plurality of access lines. Each pulse of the consecutive pulses includes a first voltage and a second voltage. The first voltage is greater in magnitude than the second voltage, and the first voltage is applied for a shorter duration than the second voltage.

20 Claims, 18 Drawing Sheets

Related U.S. Application Data

Jan. 15, 2016, now Pat. No. 9,747,991, which is a continuation of application No. 14/331,056, filed on Jul. 14, 2014, now Pat. No. 9,257,180, which is a continuation of application No. 13/971,626, filed on Aug. 20, 2013, now Pat. No. 8,780,638, which is a continuation of application No. 13/480,378, filed on May 24, 2012, now Pat. No. 8,537,620, which is a continuation of application No. 13/047,562, filed on Mar. 14, 2011, now Pat. No. 8,194,459, which is a division of application No. 12/020,460, filed on Jan. 25, 2008, now Pat. No. 7,916,544.

(56) References Cited

U.S. PATENT DOCUMENTS

| | | | |
|---|---|---|---|
| 4,063,118 A * | 12/1977 | Nishimura | G11C 8/10 365/182 |
| 4,139,911 A | 2/1979 | Felice et al. | |
| 4,785,427 A | 11/1988 | Young | |
| 5,210,434 A | 5/1993 | Ohmi et al. | |
| 5,341,376 A | 8/1994 | Yamashita | |
| 5,517,446 A | 5/1996 | Ihara | |
| 5,537,379 A | 7/1996 | Kimura et al. | |
| 5,544,117 A | 8/1996 | Nakayama et al. | |
| 5,554,942 A | 9/1996 | Herr et al. | |
| 5,615,159 A | 3/1997 | Roohparvar | |
| 5,638,320 A | 6/1997 | Wong et al. | |
| 5,694,356 A | 12/1997 | Wong et al. | |
| 5,751,635 A | 5/1998 | Wong et al. | |
| 5,767,829 A | 6/1998 | Verhulst | |
| 5,768,191 A | 6/1998 | Choi et al. | |
| 5,818,753 A * | 10/1998 | Gotou | G11C 11/5621 365/185.23 |
| 5,873,112 A * | 2/1999 | Norman | G11C 16/10 257/E27.103 |
| 5,894,434 A | 4/1999 | Tran | |
| 5,949,722 A | 9/1999 | Liu et al. | |
| 5,991,201 A | 11/1999 | Kuo et al. | |
| 6,002,614 A | 12/1999 | Banks | |
| 6,049,482 A | 4/2000 | aritome et al. | |
| 6,097,632 A | 8/2000 | Roohparvar | |
| 6,111,789 A | 8/2000 | Choi et al. | |
| 6,172,917 B1 * | 1/2001 | Kataoka | G11C 16/10 365/185.25 |
| 6,181,599 B1 | 1/2001 | Gongwer | |
| 6,195,295 B1 | 2/2001 | McPartland | |
| 6,219,291 B1 * | 4/2001 | Sowards | G11C 7/067 365/207 |
| 6,233,198 B1 * | 5/2001 | Choi | G11C 16/08 365/189.11 |
| 6,243,297 B1 * | 6/2001 | Nagatomo | G11C 16/34 365/185.23 |
| 6,259,627 B1 | 7/2001 | Wong | |
| 6,292,868 B1 * | 9/2001 | Norman | G11C 16/10 713/320 |
| 6,301,156 B1 | 10/2001 | Kurosaki | |
| 6,301,158 B1 * | 10/2001 | Iwahashi | G11C 16/08 365/185.23 |
| 6,335,888 B2 | 1/2002 | Beigel et al. | |
| 6,515,909 B1 | 2/2003 | Wooldridge | |
| 6,515,919 B1 | 2/2003 | Lee | |
| 6,542,412 B2 * | 4/2003 | Ogura | G11C 16/0425 257/315 |
| 6,614,292 B1 | 9/2003 | Chung et al. | |
| 6,621,745 B1 | 9/2003 | Manea | |
| 6,744,670 B2 | 6/2004 | Tamada et al. | |
| 6,781,895 B1 | 8/2004 | Tanaka et al. | |
| 6,882,559 B2 | 4/2005 | Masui et al. | |
| 6,888,571 B1 | 5/2005 | Koshizuka et al. | |
| 6,909,631 B2 | 6/2005 | Durlam et al. | |
| 7,002,843 B2 | 2/2006 | Guterman et al. | |
| 7,057,936 B2 | 6/2006 | Yaegashi et al. | |
| 7,102,909 B2 | 9/2006 | Koide | |
| 7,120,063 B1 | 10/2006 | Liu et al. | |
| 7,161,830 B2 | 1/2007 | Miwa et al. | |
| 7,257,028 B2 | 8/2007 | Lee | |
| 7,286,397 B2 | 10/2007 | Miwa et al. | |
| 7,355,887 B2 | 4/2008 | Nakamura et al. | |
| 7,436,698 B2 | 10/2008 | Lin et al. | |
| 7,616,484 B2 | 11/2009 | Auclair et al. | |
| 7,630,240 B2 | 12/2009 | Roohparvar | |
| 7,656,710 B1 | 2/2010 | Wong | |
| 7,702,942 B2 | 4/2010 | Chen et al. | |
| 7,916,544 B2 | 3/2011 | Tanzawa | |
| 8,085,596 B2 | 12/2011 | Sarin et al. | |
| 8,385,115 B2 | 2/2013 | Lee et al. | |
| 8,593,877 B2 | 11/2013 | Joo | |
| 8,599,617 B2 | 12/2013 | Shiino et al. | |
| 9,747,991 B2 | 8/2017 | Tanzawa | |
| 2001/0026473 A1 | 10/2001 | Sano | |
| 2002/0036930 A1 | 3/2002 | Shibata et al. | |
| 2002/0057598 A1 | 5/2002 | Sakamoto | |
| 2002/0085423 A1 * | 7/2002 | Tedrow | G11C 16/28 365/185.21 |
| 2002/0110028 A1 * | 8/2002 | Hassan | G11C 29/50004 365/200 |
| 2002/0114192 A1 * | 8/2002 | Takase | G11C 16/10 365/185.28 |
| 2002/0136055 A1 | 9/2002 | Jyouno et al. | |
| 2003/0103384 A1 | 6/2003 | Takahashi | |
| 2003/0123289 A1 * | 7/2003 | Mihara | G11C 8/08 365/185.18 |
| 2003/0147278 A1 | 8/2003 | Tanaka et al. | |
| 2003/0147297 A1 * | 8/2003 | Shiota | G11C 7/1006 365/185.11 |
| 2003/0151950 A1 | 8/2003 | Tamada et al. | |
| 2003/0206451 A1 | 11/2003 | Tanaka et al. | |
| 2003/0235080 A1 | 12/2003 | Yaegashi et al. | |
| 2004/0109362 A1 | 6/2004 | Gongwer et al. | |
| 2004/0130942 A1 * | 7/2004 | Yeh | G11C 16/3404 365/185.01 |
| 2004/0145024 A1 | 7/2004 | Chen et al. | |
| 2004/0196721 A1 * | 10/2004 | Terzioglu | G11C 29/848 365/222 |
| 2004/0233751 A1 | 11/2004 | Mihnea et al. | |
| 2004/0240271 A1 | 12/2004 | Tanzawa et al. | |
| 2005/0083726 A1 | 4/2005 | Auclair et al. | |
| 2005/0094472 A1 | 5/2005 | Ishikawa et al. | |
| 2005/0105334 A1 | 5/2005 | Futatsuyama | |
| 2005/0117399 A1 | 6/2005 | Kwon et al. | |
| 2005/0122780 A1 | 6/2005 | Chen et al. | |
| 2005/0127937 A1 * | 6/2005 | Dachtera | H03K 19/00384 257/E29.281 |
| 2005/0128807 A1 * | 6/2005 | Chen | G11C 8/08 365/185.17 |
| 2005/0141261 A1 | 6/2005 | Ahn | |
| 2005/0157549 A1 | 7/2005 | Mokhlesi et al. | |
| 2005/0157555 A1 | 7/2005 | Ono et al. | |
| 2005/0162916 A1 | 7/2005 | Guterman et al. | |
| 2005/0162924 A1 | 7/2005 | Guterman et al. | |
| 2005/0162940 A1 | 7/2005 | Miwa et al. | |
| 2005/0181554 A1 | 8/2005 | Murakuki et al. | |
| 2005/0195638 A1 | 9/2005 | Benzinger et al. | |
| 2005/0201159 A1 | 9/2005 | Yamada | |
| 2005/0207201 A1 | 9/2005 | Madan et al. | |
| 2005/0213385 A1 | 9/2005 | Hosono et al. | |
| 2005/0232013 A1 | 10/2005 | Kawai et al. | |
| 2005/0237829 A1 | 10/2005 | Nakamura et al. | |
| 2005/0248979 A1 | 11/2005 | Karlsson et al. | |
| 2005/0254302 A1 | 11/2005 | Noguchi | |
| 2005/0269628 A1 | 12/2005 | King | |
| 2005/0281085 A1 | 12/2005 | Wu | |
| 2005/0281109 A1 | 12/2005 | Martelloni et al. | |
| 2005/0286301 A1 | 12/2005 | Mochizuki | |
| 2005/0286328 A1 | 12/2005 | Kurosaki et al. | |
| 2006/0013043 A1 | 1/2006 | Matsuoka | |
| 2006/0023503 A1 * | 2/2006 | Lee | G11C 14/00 365/185.05 |
| 2006/0033146 A1 | 2/2006 | Wang | |
| 2006/0043411 A1 * | 3/2006 | Bhattacharyya | H01L 29/749 257/E21.679 |

(56) References Cited

U.S. PATENT DOCUMENTS

| | | |
|---|---|---|
| 2006/0056236 A1 | 3/2006 | Hidaka |
| 2006/0079053 A1* | 4/2006 | Chen .................. H01L 21/28114 |
| | | 257/E21.205 |
| 2006/0081944 A1 | 4/2006 | Madan |
| 2006/0083064 A1 | 4/2006 | Edahiro et al. |
| 2006/0120162 A1 | 6/2006 | Fujiu et al. |
| 2006/0120165 A1 | 6/2006 | Hemink |
| 2006/0133153 A1 | 6/2006 | Shih et al. |
| 2006/0245246 A1 | 11/2006 | Lung |
| 2006/0256620 A1 | 11/2006 | Nguyen et al. |
| 2007/0017174 A1 | 1/2007 | Lavell |
| 2007/0025166 A1 | 2/2007 | Fang et al. |
| 2007/0030737 A1 | 2/2007 | Aritome |
| 2007/0036001 A1 | 2/2007 | Kanda et al. |
| 2007/0047311 A1 | 3/2007 | Yip |
| 2007/0064473 A1 | 3/2007 | Lee et al. |
| 2007/0067706 A1 | 3/2007 | Azimane et al. |
| 2007/0081393 A1 | 4/2007 | Lue et al. |
| 2007/0086251 A1 | 4/2007 | Lutze et al. |
| 2007/0091688 A1 | 4/2007 | Pabustan |
| 2007/0103960 A1 | 5/2007 | Hamberg et al. |
| 2007/0115729 A1 | 5/2007 | Chen |
| 2007/0133295 A1 | 6/2007 | Fong et al. |
| 2007/0140016 A1 | 6/2007 | Kamei |
| 2007/0147113 A1 | 6/2007 | Mokhlesi et al. |
| 2007/0153583 A1 | 7/2007 | Guterman |
| 2007/0153594 A1 | 7/2007 | Chen |
| 2007/0171725 A1* | 7/2007 | Chan .................. G11C 11/5628 |
| | | 365/185.22 |
| 2007/0171744 A1 | 7/2007 | Mokhlesi et al. |
| 2007/0230235 A1 | 10/2007 | Abe et al. |
| 2008/0205156 A1 | 8/2008 | Seol et al. |
| 2009/0190406 A1 | 7/2009 | Tanzawa |
| 2010/0284212 A1 | 11/2010 | Bedeschi et al. |
| 2011/0216608 A1 | 9/2011 | Hold et al. |
| 2011/0292724 A1 | 12/2011 | Kim |
| 2013/0094294 A1 | 4/2013 | Kwak et al. |
| 2013/0182506 A1 | 7/2013 | Melik-Martirosian |
| 2013/0233163 A1 | 8/2013 | Chen |
| 2013/0250654 A1 | 9/2013 | Sugimae et al. |
| 2013/0250689 A1 | 9/2013 | Lai et al. |
| 2013/0314995 A1 | 11/2013 | Dutta et al. |
| 2014/0003125 A1 | 1/2014 | Koushan et al. |
| 2014/0211568 A1 | 7/2014 | Mui et al. |
| 2014/0269057 A1 | 9/2014 | Shereshevski et al. |
| 2014/0269068 A1 | 9/2014 | d'Abreu et al. |
| 2014/0369122 A1 | 12/2014 | Costa et al. |
| 2015/0023089 A1 | 1/2015 | Kolluri et al. |
| 2015/0270003 A1 | 9/2015 | Jeong et al. |
| 2016/0071584 A1 | 3/2016 | Castro et al. |
| 2016/0093382 A1 | 3/2016 | Sakamoto et al. |
| 2016/0314843 A1 | 10/2016 | Tseng et al. |
| 2016/0322109 A1 | 11/2016 | Kim |
| 2016/0343419 A1 | 11/2016 | Park et al. |
| 2016/0351257 A1 | 12/2016 | Wu et al. |
| 2016/0351258 A1 | 12/2016 | Taub et al. |
| 2017/0125103 A1 | 5/2017 | Wong |
| 2017/0140807 A1 | 5/2017 | Sun et al. |
| 2017/0200508 A1 | 7/2017 | Grigoriev et al. |
| 2017/0206124 A1 | 7/2017 | Lim et al. |
| 2017/0229166 A1 | 8/2017 | Wang et al. |
| 2017/0229169 A1 | 8/2017 | Jo et al. |
| 2018/0276072 A1* | 9/2018 | Kodama ................ G11C 16/26 |
| 2023/0058836 A1* | 2/2023 | Pachamuthu ....... G11C 11/5628 |
| 2023/0069603 A1* | 3/2023 | Parry .................... G06F 3/0604 |

OTHER PUBLICATIONS

Kurata, H., et al.; The Impact of Random Telegraph Signals on the Scaling of Multilevel Flash Memories; 2006 Symposium on VLSI Circuits Digest of Technical Papers; 2006 IEEE.

Bloom, I., et al.; 1/f noise reduction of metal-oxide-semiconductor transistors by cycling from inversion to accumulation; Appl. Phys. Lett., vol. 58, No. 15,; Apr. 15, 1991; pp. 1664-1666.

Dierickx, B., et al.; The decrease of "random telegraph signal" noise in metal oxide-semiconductor field-effect transistors when cycled from inversion to accumulation; J. Appl. Phys., vol. 71, No. 4, Feb. 15, 1992; pp. 2028-2029.

Imamlya, K., et al.; A 130MM2 256 Mb NAND Flash with Shallow Trench Isolation Technology; Digest of Technical Papers; 1999 IEEE International Solid-State Circuits Conference; pp. 112-113, 152.

Bauer, M., et al.; A Multilevel-Cell 32Mb Flash Memory; Digest of Technical Papers; Solid-State Circuits Conference, 1995;IEEE International pp. 132-133, 351.

Ohsawa, T., et al.; Memory Design Using One-Transistor Gain Cell on Soi; ISSCC 2002, Feb. 5, 2002.

Gill, M, et al; Ovonic Unified Memory—A High-Performance Nonvolatile Memory Technology for Stand-Alone Memory and Embedded Applications; Solid-State Circuits Conference, 2002, Digest of Technical Papers, ISSCC, 2002 EEE International vol. 2, pp. 158.

Gogl, D., et al.; A 16-Mb MRAM Featuring Bootstrapped Write Drivers; IEEE Journal of Solid-State Circuits, vol. 40, No. 4, Apr. 2005, pp. 902-908.

Inoue, A., et al.; NAND Flash Applications Design Guide; System Solutions from Toshiba America Electronic Components, Inc., Revision 1.0, Apr. 2003.

* cited by examiner

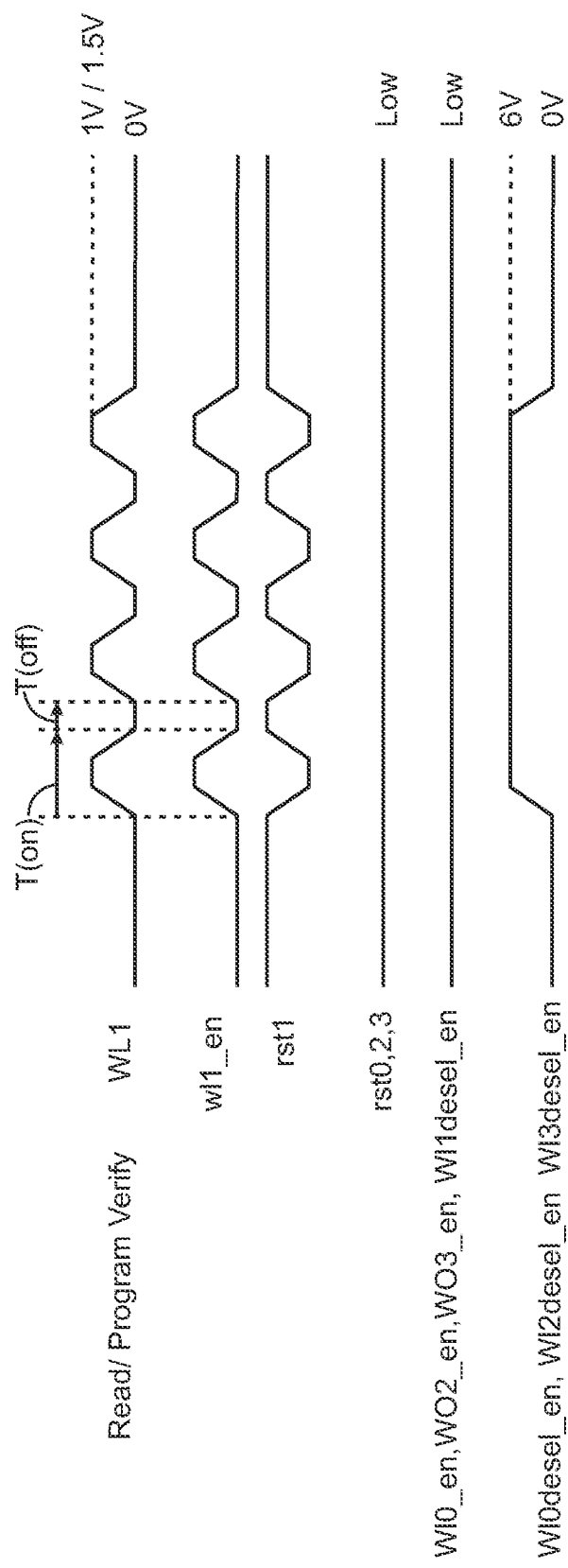

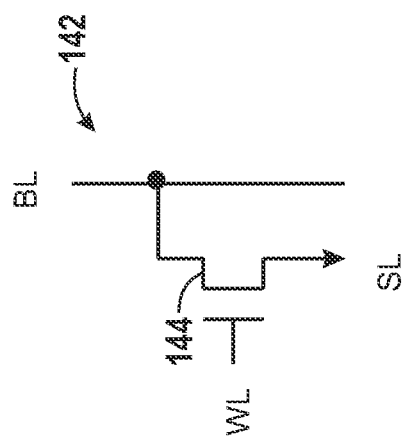
FIG. 11C
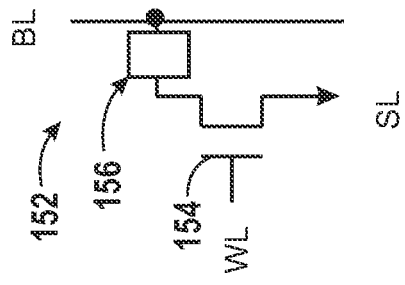
FIG. 11E
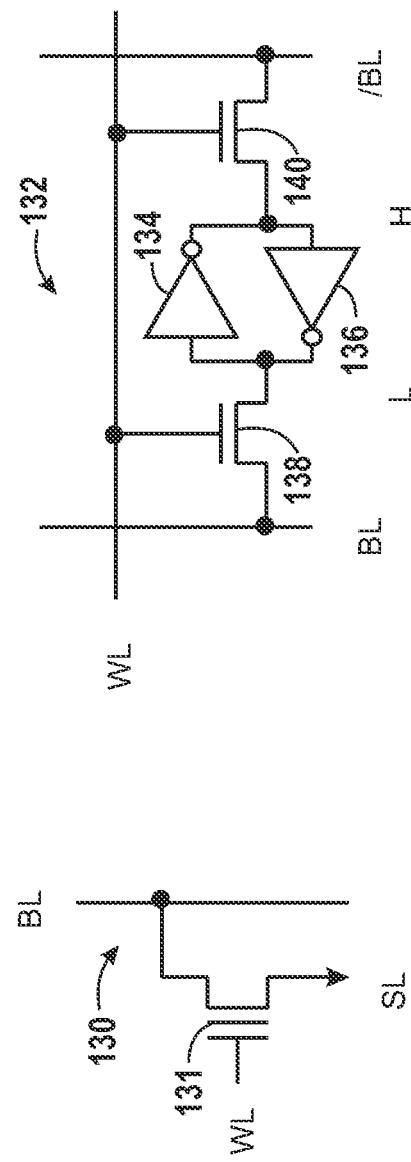
FIG. 11B
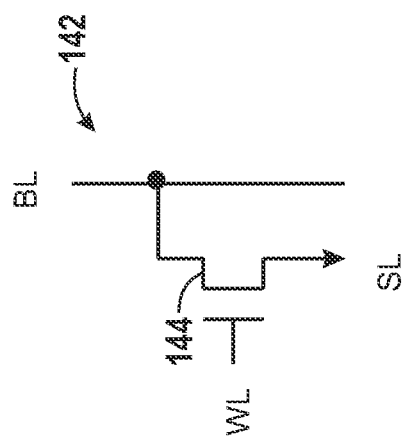
FIG. 11A
FIG. 11D

RANDOM TELEGRAPH SIGNAL NOISE REDUCTION SCHEME FOR SEMICONDUCTOR MEMORIES

CROSS-REFERENCE TO RELATED APPLICATION

This application is a continuation of U.S. patent application Ser. No. 17/245,275, which was filed on Apr. 30, 2021, which is a continuation of U.S. patent application Ser. No. 16/700,641, which was filed on Dec. 2, 2019, now U.S. Pat. No. 10,998,054, which was issued on May 5, 2021, which is continuation of U.S. patent application Ser. No. 16/141,717, which was filed on Sep. 25, 2018, now U.S. Pat. No. 10,510,420, which was issued on Dec. 17, 2019, which is continuation of U.S. patent application Ser. No. 15/673,218, which was filed on Aug. 9, 2017, now U.S. Pat. No. 10,102,914, which was issued on Oct. 16, 2018, which is a continuation of U.S. patent application Ser. No. 14/997,278, which was filed on Jan. 15, 2016, now U.S. Pat. No. 9,747,991, which issued on Aug. 29, 2017, which is a continuation of U.S. patent application Ser. No. 14/331,056, which was filed on Jul. 14, 2014, now U.S. Pat. No. 9,257,180, which issued on Feb. 9, 2016, which is a continuation of U.S. patent application Ser. No. 13/971,626, which was filed on Aug. 20, 2013, now U.S. Pat. No. 8,780,638, which issued on Jul. 15, 2014, which is a continuation of U.S. patent application Ser. No. 13/480,378, which was filed on May 24, 2012, now U.S. Pat. No. 8,537,620, which issued on Sep. 17, 2013, which is a continuation of U.S. patent application Ser. No. 13/047,562, which was filed on Mar. 14, 2011, now U.S. Pat. No. 8,194,459, which issued on Jun. 5, 2012, which is a divisional of U.S. patent application Ser. No. 12/020,460, which was filed on Jan. 25, 2008, now U.S. Pat. No. 7,916,544, which issued on Mar. 29, 2011.

BACKGROUND

Field of the Invention

Embodiments of the invention relate generally to the field of memory devices and more particularly, to reducing the effect of random telegraph signal noise (RTS noise) in semiconductor memories.

Description of the Related Art

Flash memory is a non-volatile memory that can be electrically erased and reprogrammed. It is primarily used in memory cards, USB flash drives, and the like for storage of data in computer systems. Generally, flash memory stores information in an array of floating gate transistors, called "cells", each of which traditionally stores one bit of information that is represented as a "0" or a "1". Each cell is characterized by a threshold voltage (Vt) that varies based on the data stored in the cell. For example, during program and erase operations, charge is added or removed from a floating gate to change the cell's threshold voltage, thereby defining whether the cell is programmed or erased. During a read operation, a read voltage is applied to the cell and a response of the cell (e.g., a current across the cell) is monitored to determine whether the threshold voltage is above or below the read voltage. In other words, the read operation can determine if the cell is programmed as a 1 or a 0 value. Multi-level cells may include multiple threshold voltage ranges that are representative of additional values, such as two or more bits of information.

Flash memories may also employ a verify operation that ensures that each cell is programmed as a given state, such as a 1 or a 0. The verify operation may provide a sufficient margin between the 1 and 0 states such that a cell is charged to a given range and does not charge to an intermediate state where the cell may be read incorrectly. However, when the memory cells are programmed at one temperature and are read out at another temperature, the margin may decrease, potentially causing the value of the cell to be read incorrectly. For example, when the read operation is executed during a first period at a first temperature, the data may tend to be a 0, and when the read operation is executed during a second period at a second temperature, the data may tend to be a 1. This is prevalent where a word line voltage is a constant voltage value over the range of temperatures. The variations may be attributed to random telegraph noise (RTS noise) and the resulting time dependency of the current that passes through the memory cell. The RTS noise can be attributed to the trap and detrap of electrons or the recombination of electrons with holes. Unfortunately, the presence of the RTS noise and the resulting inaccuracies in reading the memory cells may produce inaccurate and/or less reliable memory devices.

Embodiments of the present invention may be directed to one or more of the problems set forth above.

BRIEF DESCRIPTION OF THE DRAWINGS

FIG. 7C is a timing diagram of operating the NAND flash memory in accordance with one or more embodiments of the present invention;

FIGS. 11A-11E are schematic diagrams of devices that can employ techniques in accordance with one or more embodiments of the present invention.

DETAILED DESCRIPTION OF SPECIFIC EMBODIMENTS

As discussed in further detail below, the disclosed systems and methods relate to a random telegraph noise (RTS noise) reduction scheme for semiconductor memory devices. In certain embodiments, signals to the word line and/or the select gate are pulsed to enable trapped electrons in the semiconductor to recombine with holes (i.e., detrap) during an accumulation period, to reduce the electron trap for the next inversion period. Detrap should reduce the RTS noise, thereby increasing the verify margin between states. In other words, the uncertainty that is present due to RTS noise during read and verify operations should be reduced. Before a detailed discussion of the system and methods described in accordance with various embodiments of the present invention, it may be beneficial to discuss embodiments of memory devices that may incorporate the devices described herein, in accordance with embodiments of the present technique.

Figure 1:
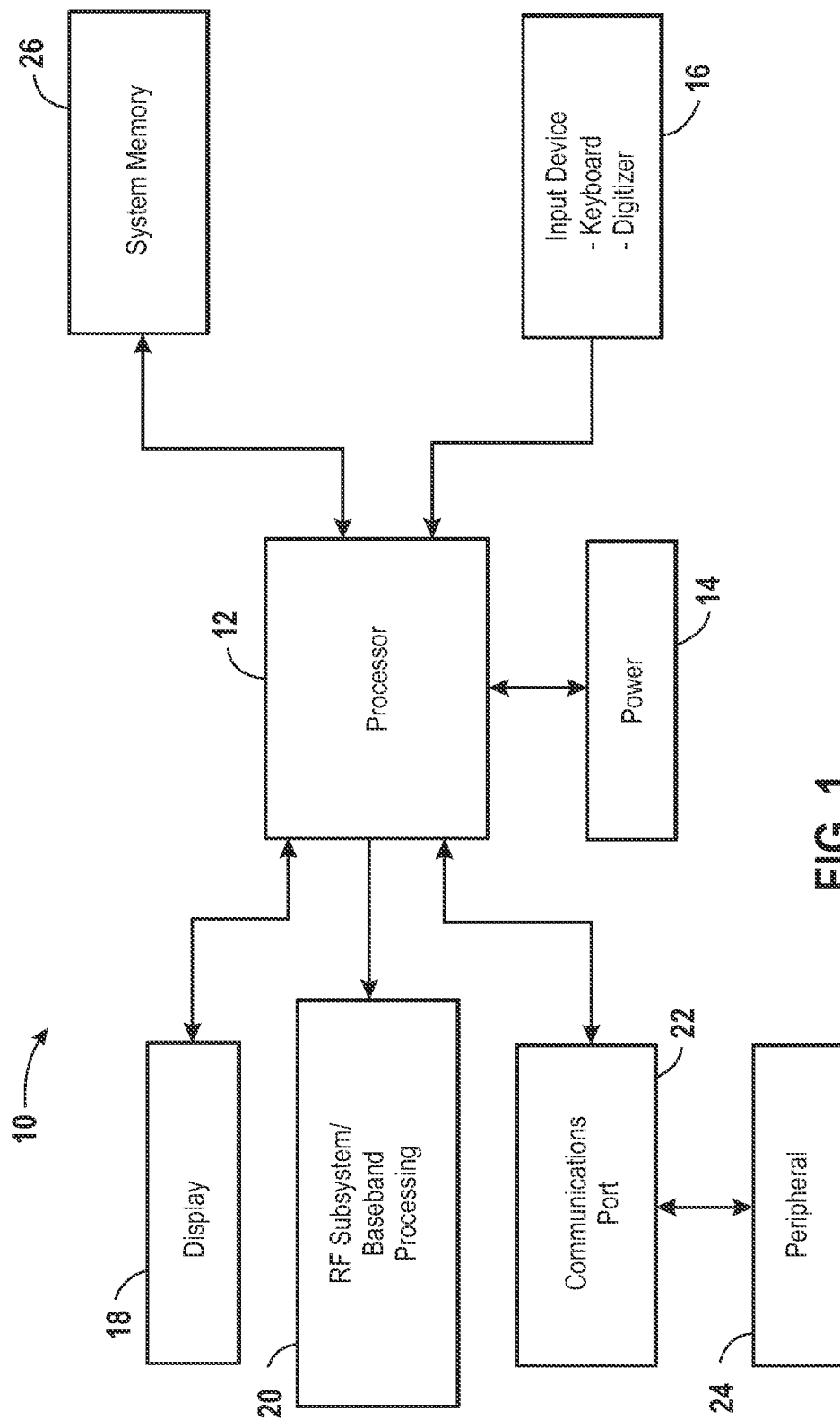
FIG. 1 is a block diagram that illustrates a processor-based device having a memory that includes memory devices fabricated in accordance with one or more embodiments of the present invention.

Turning now to the figures, FIG. 1 includes a block diagram depicting a processor-based system, generally designated by reference numeral 10. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so that the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used in conjunction with the processor 12. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As discussed in further detail below, the system memory 26 may include one or more memory devices, such as flash memory devices, that include a floating gate memory array fabricated and implementing techniques in accordance with one or more embodiments of the present invention.

Figure 2:
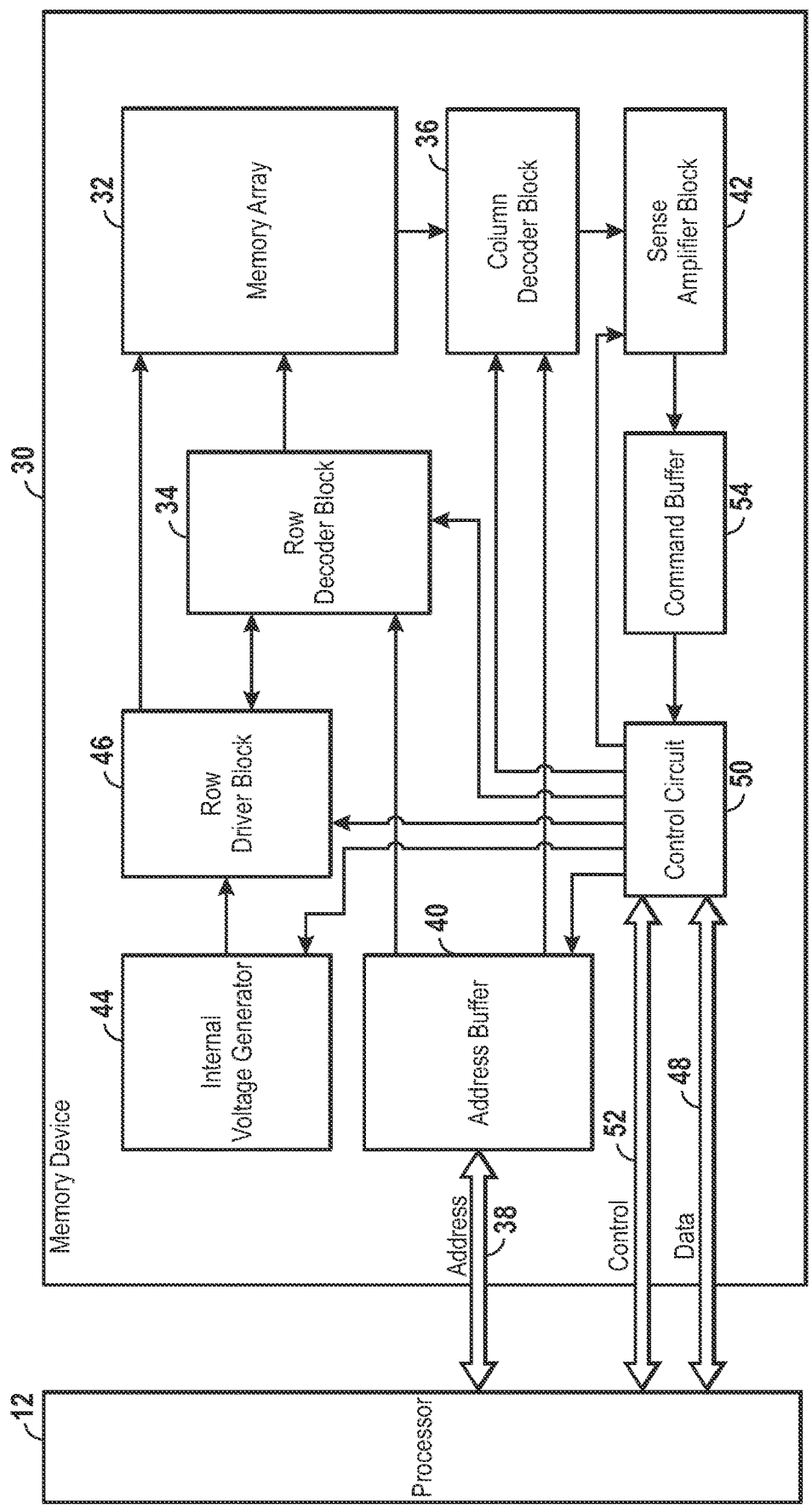
FIG. 2 is a block diagram that illustrates a memory device having a memory array fabricated in accordance with one or more embodiments of the present invention.

FIG. 2 is a block diagram that illustrates a flash memory device 30 that may be included as a portion of the system memory 26 of FIG. 1. As will be discussed in further detail with respect to FIG. 3, the flash memory device 30 may be a NAND flash memory device. The flash memory device 30 generally includes a memory array 32. The memory array 32 generally includes many rows and columns of conductive traces arranged in a grid pattern. "Access lines" are used to access cells and generally correspond to the rows or "row lines" of the memory array 32. In the conventional art, they are generally referred to as "word lines." "Data lines" generally correspond to the columns or "column lines." In the conventional art, they are generally referred to as "digit (e.g., bit) lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 and the address buffer 40 and to access a particular memory cell in the memory array 32. A sense amplifier block 42, having a plurality of the sense amplifiers, is also provided inline with the column decoder 36 and the memory array 32. The sense amplifier block 42 senses and amplifies individual values stored in the memory cells. A row driver block 46 is provided to activate a selected word line in the memory array according to a given row address.

An internal voltage source 44, such as a voltage generator, is provided to deliver voltages for use within the memory device 30. The internal voltage source 44 may provide voltage levels for program, program, read, verify, and erase operations. The internal voltage source 44 may include a trimming circuit to accurately regulate the voltage level output by the internal voltage source 44.

During read and program operations, data may be transferred to and from the flash memory device 30 via the data bus 48. The coordination of the data and address information may be conducted through a control circuit 50. The control circuit 50 may be configured to receive control signals from the processor 12 via the control bus 52. A command buffer 54 may be configured to temporarily store commands of the control circuit 50. The control circuit 50 is coupled to each of the row decoder block 34, the column decoder block 36, the address buffer 40, the sense amplifier block 42, the internal voltage generator 44, the row driver block 46, and the command buffer 54, and is generally configured to coordinate timing and control among the various circuits in the flash memory device 30.

Figure 3:
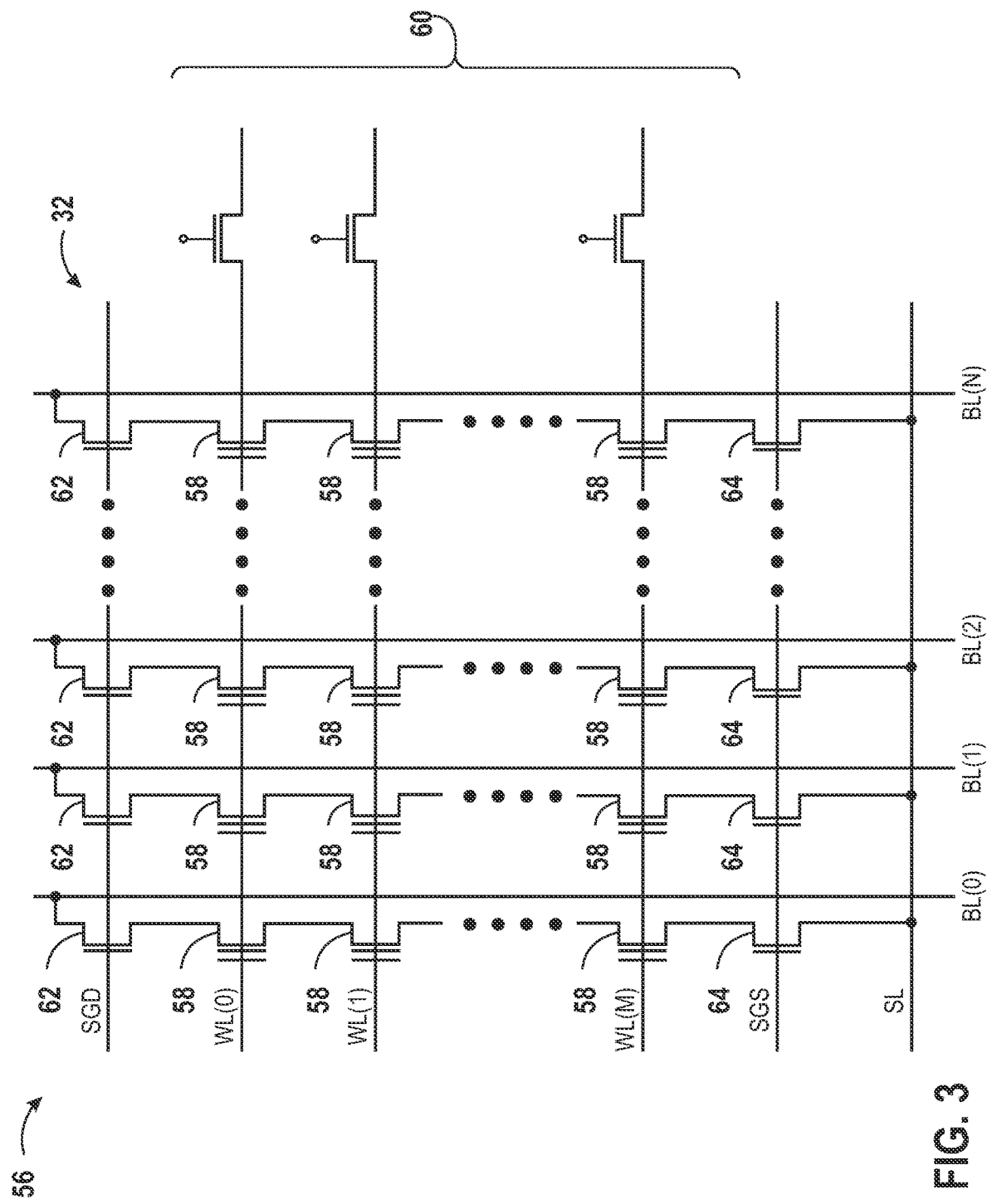
FIG. 3 is a schematic diagram of a NAND flash memory array having memory cells fabricated in accordance with one or more embodiments of the present invention.

FIG. 3 illustrates an embodiment of the memory array 32, of FIG. 2. In the illustrated embodiment, the memory array 32 includes a NAND memory array 56. The NAND memory array 56 includes word lines WL(0)-WL(M) and intersecting local bit lines BL(0)-BL(N). As will be appreciated, for ease of addressing in the digital environment, the number of word lines WL and the number of bit lines BL are each a power of two (e.g., 256 word lines (WL) by 4,096 bit lines (BL)). The local bit lines BL are coupled to global bit lines (not shown) in a many-to-one relationship.

The NAND memory array 56 includes a floating gate transistor 58 located at each intersection of a word line (WL) and a local bit line (BL). The floating gate transistors 58 serve as non-volatile memory cells for storage of data in the NAND memory array 56, as previously discussed. As will be appreciated, each floating gate transistor includes a source, a drain, a floating gate, and a control gate. The control gate of each floating gate transistor 58 is coupled to a respective word line (WL). The floating gate transistors 58 are connected in series, source to drain, to form a NAND string 60 formed between gate select lines. Specifically, the NAND strings 60 are formed between the drain select line (SGD) and the source select line (SGS). The drain select line (SGD) is coupled to each NAND string 60 through a respective drain select gate 62. Similarly, the source select line (SGS) is coupled to each NAND string 60 through a respective source select gate 64. The drain select gates 62 and the source select gates 64 may each comprise a field-effect transistor (FET), for instance. A column of the memory array 56 includes a NAND string 60 and the source select gate 64 and drain select gate 62 connected thereto. A row of the floating gate transistors 58 are those transistors commonly coupled to a given word line (WL).

The source of each source select gate 64 is connected to a common source line (SL). The drain of each source select gate 64 is coupled to the source of a floating gate transistor 58 in a respective NAND string 60. The gate of each source select gate 64 is coupled to the source select line (SGS).

The drain of each drain select gate 62 is connected to a respective local bit line (BL) for the corresponding NAND string 60. The source of each drain select gate 62 is connected to the drain of a floating gate transistor 58 of a respective NAND string 60. Accordingly, as illustrated in FIG. 3, each NAND sting 60 is coupled between a respective drain select gate 62 and source select gate 64. The gate of each drain select gate 62 is coupled to the drain select line (SGD).

During operation of the flash memory device 30, multiple voltages are generated within the memory device 30 to accomplish various tasks. For example, the memory device 30 may employ multiple voltage levels applied to the word lines, bit lines, and the like, to program, read, erase and verify values stored in the cells of the memory array 32. Specifically, the flash memory device 30 may employ a verify operation that ensures that each cell is programmed as in a given state, such as a 1 or a 0. The verify operation may provide a sufficient margin between the 1 and 0 states such that a selected cell is charged into a given range and does not charge to an intermediate state that may cause the selected cell to be read incorrectly. However, when the memory cells are programmed at one temperature and are read out at another temperature, the margin may decrease, leading to a possibility that the value of the selected cell may be read incorrectly.

Figure 4:
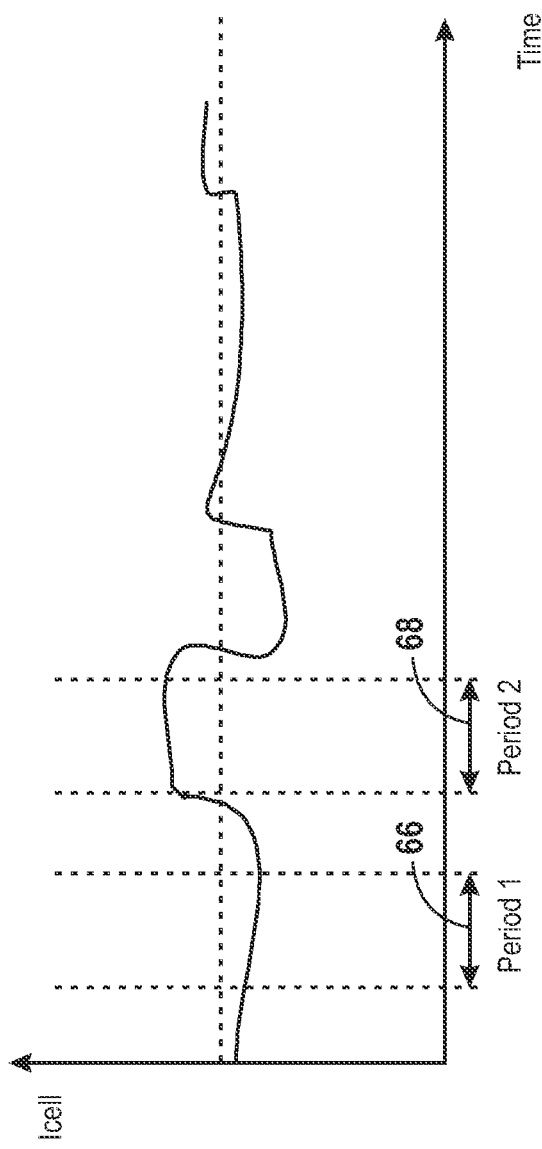
FIG. 4 is a graph that illustrates the variation in a cell current over various periods.

For example, as illustrated in FIG. 4, when the read operation is executed during a first period 66 at a first temperature, the level of a sensed current (Icell) across the selected cell may be indicative of a 0 value, and when the read operation is executed during a second period 68 at a second temperature, the level of the sensed current (Icell) across the selected cell may be indicative of a 1 value. This is prevalent where a word line voltage is a constant voltage value over the range of temperatures. The variations may be attributed, at least partially, to random telegraph noise (RTS noise) and the resulting time dependency of the current that passes through the memory cell. The RTS noise can be attributed to the trap and detrap of electrons or the recombination of electrons with holes. Unfortunately, the presence of the RTS noise and the resulting inaccuracies in reading the memory cells may produce inaccurate results and/or reduce the reliability of the memory device. The following techniques for reducing RTS noise are discussed in the context of a NAND flash memory device and, to simplify the discussion, are discussed in the context of a single column of a NAND memory array.

Figure 5:
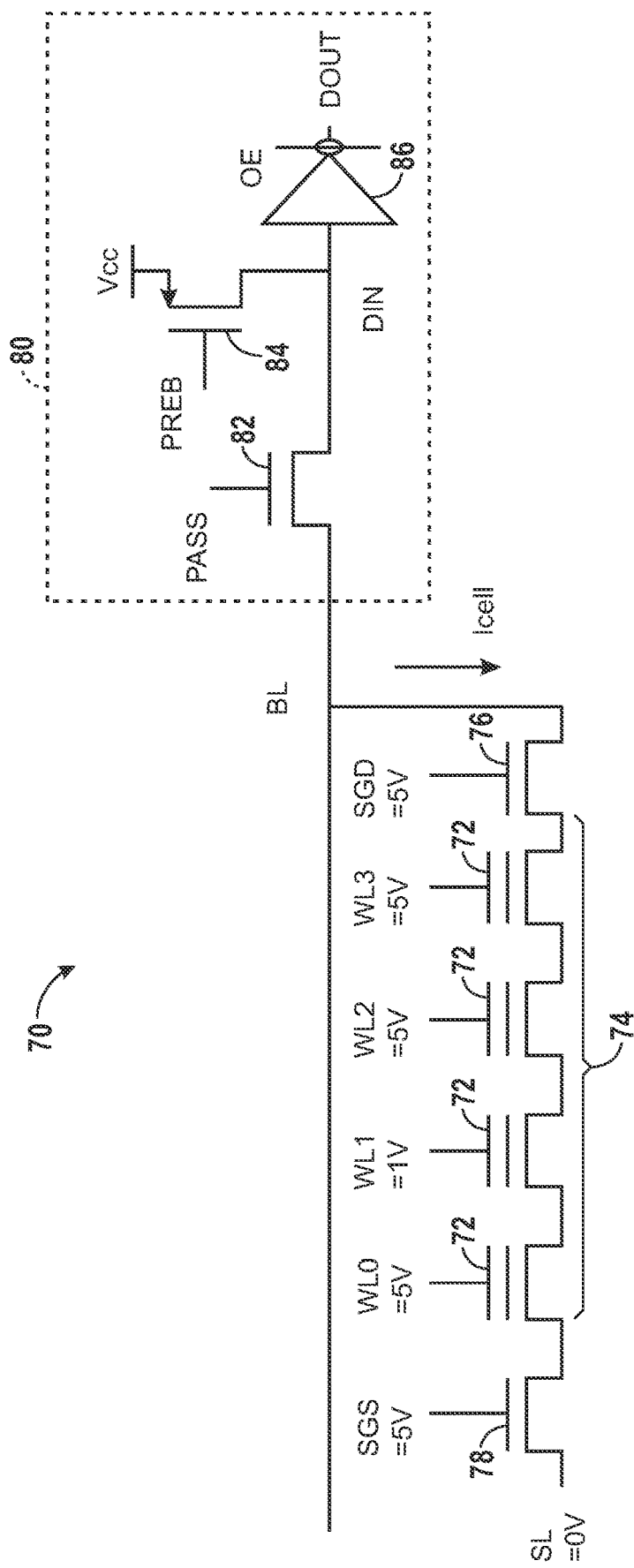
FIG. 5 is a schematic diagram of a column of the NAND flash memory in accordance with one or more embodiments of the present invention.

FIG. 5 is a schematic diagram of a column 70 of a NAND memory array. The column 70 includes a floating gate transistor (i.e., a cell) 72 located at each intersection of a word line (WL) (e.g., WL0, WL1, WL2, WL3) and a local bit line (BL). The control gate of each cell 72 is coupled to a respective word line (WL).

The cells 72 are connected in series, source to drain, to form a NAND string 74 formed between a drain select line (SGD) and a source select line (SGS). The drain select line (SGD) is coupled to the NAND string 74 through a respective drain select gate transistor 76, and the source select line (SGS) is coupled to the NAND string 74 through a respective source select gate transistor 78. The source of the source select gate transistor 78 is connected to a common source line (SL), the drain of the source select gate transistor 78 is coupled to the source of a cell 72 of the NAND string 74, and the gate of the source select gate transistor 78 is coupled to the source select line (SGS). The drain of the drain select gate transistor 76 is connected to the local bit line (BL) of the NAND string 74, the source of the drain select gate transistor (SGD) 76 is connected to the drain of a cell 72 of the NAND string 74, and the gate of the drain select gate transistor 76 is coupled to the drain select line (SGD).

The local bit line (BL) is coupled to a sense amplifier 80. The sense amplifier 80 includes a PASS transistor 82, a PREB transistor 84, and an inverter 86. The bit line (BL) is coupled to a source of the PASS transistor 82. The gate of the PASS transistor 82 is coupled to a PASS line (PASS), and the drain of the PASS transistor 82 is coupled to a data-in node (DIN). A drain of a PREB transistor 84 is coupled to the data-in node (DIN), a source of the PREB transistor 84 is coupled to a common voltage (Vcc), and a floating gate of the PREB transistor 84 is coupled to a PREB line (PREB). The data-in node (DIN) is coupled to an input of the inverter 86 that is coupled to an output enable (OE) signal. The inverter 86 has an output on a data-out line (DOUT).

Figure 6:
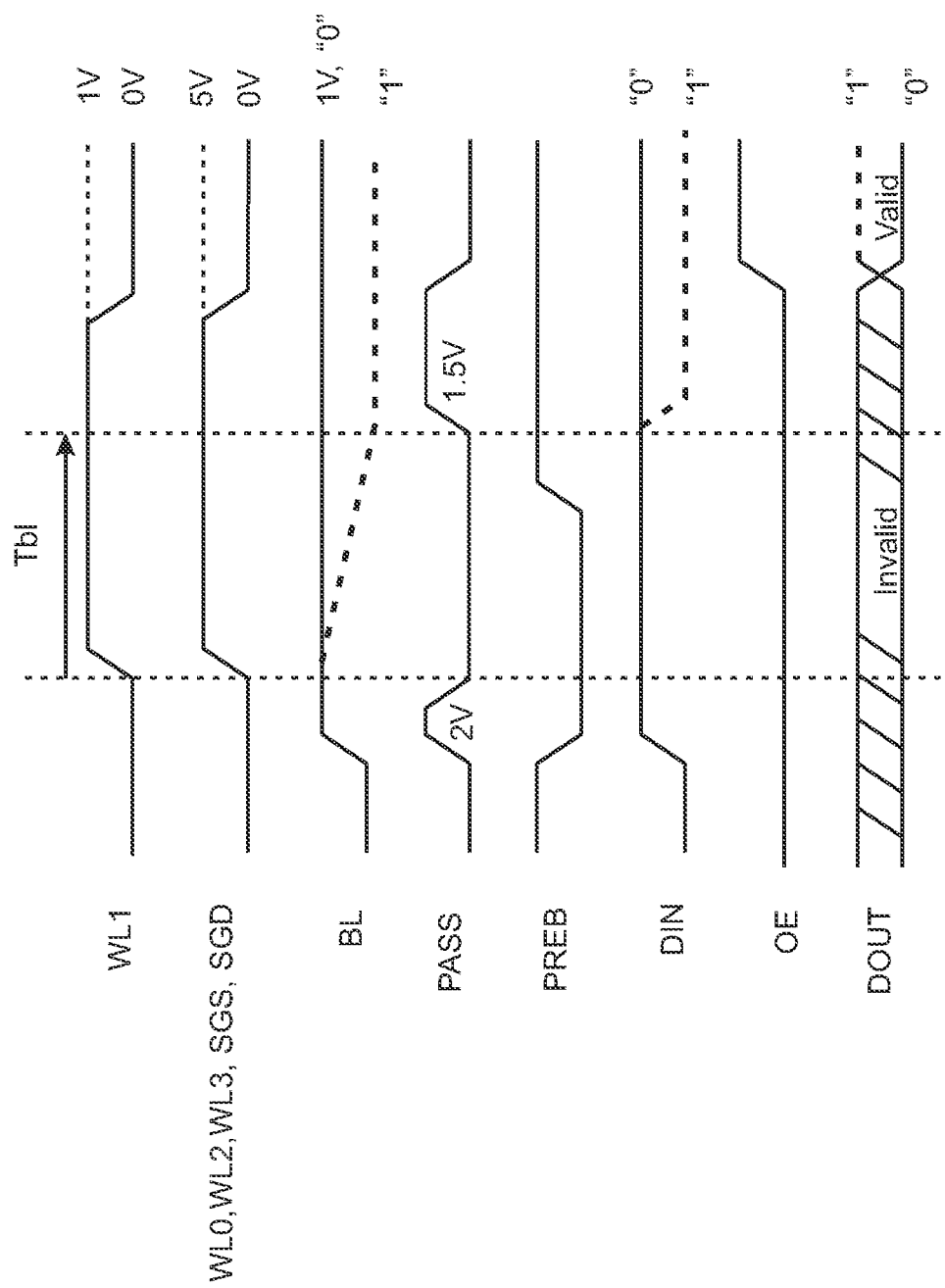
FIG. 6 is a timing diagram of operating the NAND flash memory in accordance with one or more embodiments of the present invention.

FIG. 6 is a timing diagram that illustrates signals in accordance with an operation of sensing (e.g., reading or verifying) cell data. This figure may be reviewed in conjunction with FIG. 5, for example. The bit line (BL) is precharged to about 1V (volt) with the PASS line (PASS) biased with 2V. At the beginning of a discharging period (Tb1), the word lines (WL) and the select gate signals (SGS and SGD) are transition from a low voltage to a high voltage. For example, the word line of the selected cell (WL1) is raised to about 1V. The word line to the unselected cells (WL0, WL2, and WL3) and the select gate signals (SGS and SGD) are raised to a high level, such as 5V.

After the bit line (BL) is precharged, the PASS line (PASS) is grounded to disconnect the data-in node (DIN) from the bit line (BL). Depending on the memory data, the bit line (BL) voltage is reduced or remains high. For example, where the data stored on the selected cell is "1" the bit line (BL) voltage lowers, as indicated by the dashed line that lowers to a "1" state. Where the data stored on the selected cell is "0" the bit line (BL) voltage remains high, at 1V, as indicated by the bit line (BL) signal maintaining a "0" state. During this period, the data-in node (DIN) voltage is forced to Vcc, for example 3V. At the end of the discharging period (Tb1), the PASS line (PASS) voltage is raised to 1.5V.

Where the data stored on the cell is "0", if the bit line (BL) is maintained at 1V, the gate-source voltage (Vgs) of the PASS transistor 82 is 0.5V (0.5V=1.5V−1V) and the PASS transistor 82 is in an off state, assuming the threshold voltage (Vt) of the PASS transistor 82 is about 1V. The data-in node (DIN) voltage is also maintained high as 3V. The data-out line (DOUT) voltage goes low with the output enable (OE) high. The data on the data-out line (DOUT) is transferred to a DQ pad and the resultant data represents "0".

Where the data stored on the cell is "1", if the bit line (BL) is discharged according to the cell current (Icell), the bit line (BL) voltage lowers to about 0V. The gate-source voltage (Vgs) of the PASS transistor 82 is 1.5V (1.5V=1.5V−0V) so that the PASS transistor 82 is on. The data-in node (DIN) voltage is discharged to a bit-line (BL) capacitance, resulting in a data-in (DIN) voltage of 0V. The data-out line (DOUT) transitions to high with the output enable (OE) high. The data on the data-out line (DOUT) is transferred to the DQ pad and the resultant data represents "1".

It should be noted that a similar technique may be used for a verify operation, wherein the voltage on the word line of the selected cell (WL1) is driven to a higher voltage, such as 1.5V.

As discussed previously, if the memory device 30 operates in accordance with the embodiments of FIG. 6, it may be susceptible to RTS noise that is attributable, at least in part, to the trap and detrap of electrons or a recombination of electrons with holes in the cell. The following embodiments include a method and system that includes providing a pulsed signal (rather than a constant signal) to at least one of the plurality of cells (e.g., the selected cell) and sensing a bit line current to determine whether data is stored on one of the plurality of cells. The pulsed signal(s) alternates between a high voltage level and a low voltage level to reduce the RTS noise.

Figure 7A:
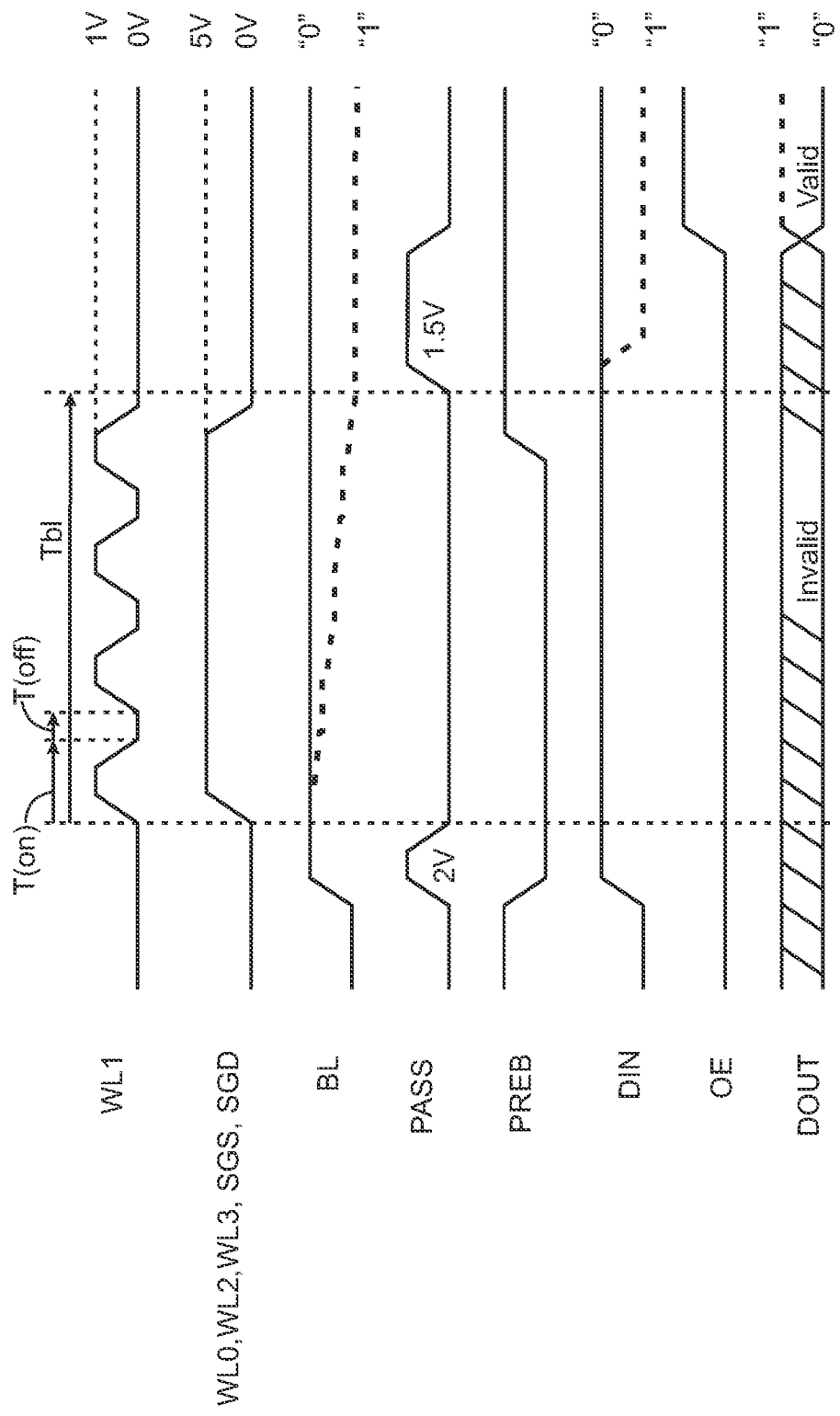
FIG. 7A is a timing diagram of operating the NAND flash memory in accordance with one or more embodiments of the present invention.

FIG. 7A is a timing diagram that illustrates signals in accordance with an embodiment of a method of operating the memory device 30. The method includes providing a pulsed (e.g., sequentially biased) signal to the selected cell. For example, in the illustrated embodiment, the word line to the selected cell (WL1) is pulsed between a low state and a high state during the discharging period (Tb1). The discharging period (Tb1) is extended for a period such that the word line signal to the selected cell (WL1) is in the high state for a total time that is approximately equal to the time period that the word line to the selected cell (WL1) is held high in an embodiment where they are not being pulsed. In other words, the total time the word line to the selected cell (WL1) is high in the discharge period (Tb1) is about the same amount of time the word line to the selected cell (WL1) is high in the illustration of FIG. 6. Where the word line to the selected cell (WL1) is pulsed, the current across the bit line (BL) is integrated over the discharging period (Tb1) to determine whether data is stored on the cell and/or to identify data stored on the cell.

During the discharging period (Tb1), the pulsed word line signal to the selected cell (WL1) alternates between a high voltage level, where the cell is on, and a low voltage level, where the cell is off. For example, in the illustrated embodiment, the high voltage level is about 1V and the low voltage level is about 0V. While the word line signal to the selected cell (WL1) is supplied with the low voltage level, the memory cell connected to (WL1) gets accumulated to detrap electrons that trap while the word line signal to the selected cell (WL1) is supplied with the high voltage level. The other signals operate similar to those discussed above with regard to FIG. 6, and incorporate a longer discharging period (Tb1). For example, the word lines to the unselected cells (WL0, WL2, and WL3) and the select gate signals (SGS and SGD) are raised to a high level, such as 5V, and are not pulsed (i.e., they are held at a constant voltage level).

Further, it is noted that the word line (WL1) is pulsed during a first time period (T(on)) and maintained in a low state during a second period (T(off)) that occurs between each of the pulses. In the illustrated embodiment the ratio of the duration of the first period to the duration of the second period (T(on)/T(off)) may be greater than 1. In other words, the duration of the first period (T(on)) may be greater than the duration of the second period (T(off)).

Figure 7B:
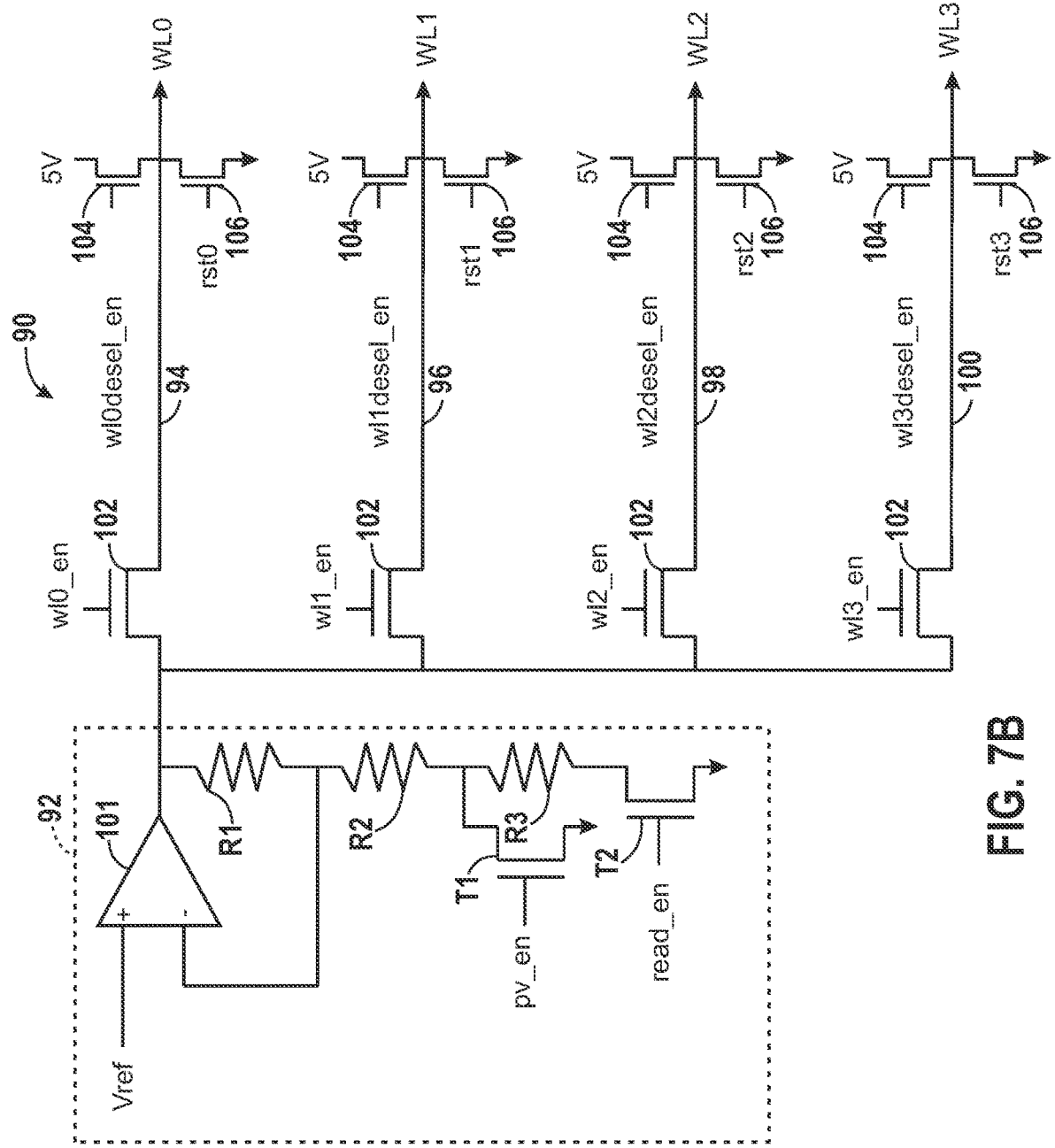
FIG. 7B is a schematic diagram of a regulator circuit in accordance with one or more embodiments of the present invention.

FIG. 7B is a schematic diagram of a regulator circuit 90 that is configured to provide voltages to the various lines of the column 70 of the memory device 30, in accordance with the technique discussed previously with regard to FIG. 7A. Specifically, the regulator circuit 90 is configured to output a pulsed signal to a selected word line and to provide constant voltages to unselected word lines. The regulator circuit 90 includes a voltage input circuit 92 coupled in parallel to output 94, 96, 98, and 100 that are coupled to the word lines (WL0, WL1, WL2, and WL3). In the illustrated embodiment, the voltage input circuit 92 includes a comparator 101, three resistors R1, R2, and R3, and two transistors T1 and T2. A reference voltage (Vref) is input to one node of the comparator 93. Control signals program verify enable (pv_en) and read enable (read_en) are input to control gate of the transistors T1 and T2, respectively.

Each of the outputs 94, 96, 98, and 100 includes an enable transistor 102, a deselect transistor 104, and a reset transistor (RST) 106. Enable signals (wl0_en, wl1_en, wl2_en, and wl3_en) are input to the control gate of the enable transistors 102 on the outputs 94, 96, 98, and 100, respectively. Disable signals (wl0desel_en, wl1desel_en, wl2desel_en, and wl3desel_en) are input to the control gate of the deselect transistor 104 on the outputs 94, 96, 98, and 100, respectively. RST signals (rst0, rst1, rst2, and rst3) are input to the reset transistor (RST) 106 on the outputs 94, 96, 98, and 100, respectively. The wordlines can be grounded with the input to the reset transistor (RST) high.

FIG. 7C is a timing diagram that illustrates signals in accordance with an embodiment of method of operating the regulator circuit 90. The diagram illustrates embodiments including, a read operation (e.g., WL1 is pulsed between 0V and 1V) or a verify operation (e.g., WL1 is pulsed between 0V and 1.5V) where the output 96 is coupled to the selected cell via the word line of the selected cell (WL1). The word line coupled to the selected cell (WL1) is pulsed as discussed above with regard to FIG. 7A. The enable signal (wl1_en) is also pulsed between a low and a high state, with a profile similar to that of the word line (WL1) coupled to the selected cell. The RST signal (rst1) input to the reset transistor (RST) 106 of the outputs 96 is also pulsed during the period when the word line (WL1) and the enable signal (wl1_en) are pulsed. However, the profile of the RST signal (rst1) is the inverse of the word line (WL1) and the enable signal (wl1_en). In other words, the RST signal (rst1) is in a low state while the word line (WL1) and the enable signal (wl1_en) are in a high state, and the RST signal (rst1) is in a high state while the word line (WL1) and the enable signal (wl1_en) are in a low state. The RST signals (rst0, rst2, and rst3), the enable signals of the unselected word line/outputs (wl0_en, wl2_en, and wl3_en), and the disable signal (wl1desel_en) of the selected word line/outputs remain in the low state. The disable signals (wl0desel_en, wl2desel_en, and wl3desel_en) of the unselected word line/outputs are driven high (e.g. to about 6V) during the period when the world line (WL1) of the selected cell is pulsed. In one embodiment, when the word line capacitance is 10 picofarad (pF), a read time is 50 microseconds (us), the number of rise and falls (pulses) for the selected word line is 10, the average current is 2 microamps (uA) ((10 pF×1 V)/(50 us×10)=2 microamps (uA)), less than 1% of the total read current.

Once again, it is noted that the wordline (WL1) is pulsed during a first time period (T(on)) and maintained in a low state during a second period (T(off)) that occurs between each of the pulses. In the illustrated embodiment the ratio of the duration of the first period to the duration of the second period (T(on)/T(off)) may be greater than 1. In other words, the duration of the first period (T(on)) may be greater than the duration of the second period (T(off)).

Figure 7D:
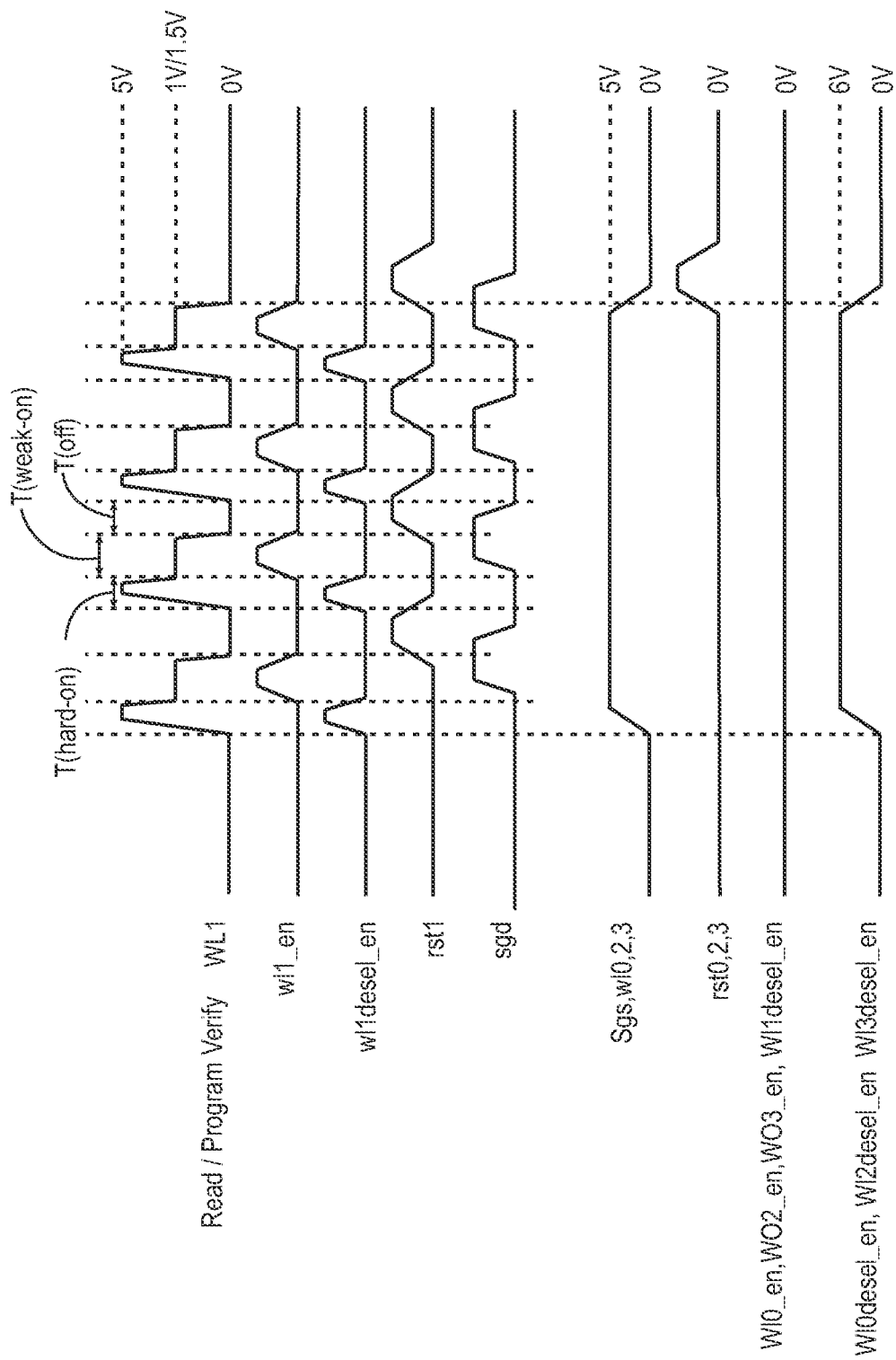
FIG. 7D is a timing diagram of operating the NAND flash memory in accordance with one or more embodiments of the present invention.

FIG. 7D is a timing diagram that illustrates signals in accordance with another embodiment of method of operating the regulator circuit 90. The diagram illustrates embodiments including, a read operation (e.g., word line (WL1) is pulsed between 0V and 1V) or a verify operation (e.g., word line (WL1) is pulsed between 0V and 1.5V) and having an additional voltage spike (e.g., an excited pulse) that includes a period in which the cell voltage level is strong (e.g., above the read or program verify voltage). In such embodiments, a trap site can be filled with electrons, and the subsequent read or program verify can be performed with the trap sites filled. For example, an embodiment may include a read or verify pulse that includes consecutive pulses wherein one or more of the pulses includes a first period in which the cell is subject to a strong (e.g., trap) voltage, a second period include the cell is subject to the read or verify voltage, and a third period in which the cell is turned off (e.g., subject to a low voltage, such as 0V). As is discussed in further detail below, each of the periods may be varied in duration to achieve desired results.

In the illustrated embodiment, the signals are controlled in a similar manner as to those discussed with regard to FIG. 7C. However, the word line (WL1) includes a multi-level pulse having a spike in the voltage level substantially above level of the read voltage level (1V) and/or the program verify voltage level (1.5V). For example, in the illustrated embodiment, the pulse of the word line (WL1) transitions to a trap voltage level (5V) during a first time period (T(hard-on)), the voltage level of the pulse transitions to read voltage level (1V) and/or the program verify voltage level (1.5V) during a second time period (T(weak-on)), and the pulse ends as the voltage level transitions back to approximately 0V during a third time period (T(off)). The enable signal (wl1_en) is high during the second period (T(weak-on)), the deselect line (wl1desel_en) is high during the first period (T(hard-on)), the RST signal (rst1) is high during the third period (Toff), and the drain select line (SGD) transitions to a high state during the second period (T(weak-on)) and transitions back to a low state during the third period (T(off)). For example, in the illustrated embodiment, the drain select line (SGD) transitions from a low state to a high state after the transition of the word line (WL1) from the trap voltage level (5V) to the read voltage level (1V) and/or the program verify voltage level (1.5V), and transitions back to a low state before the next pulse in the sequence. Discharge may occur when the word line (WL1) is 1V or 1.5V and the gate signal (SGD) is high.

It is also noted that in the illustrated embodiment the ratio of the duration of the second time period to the duration of the third time period (T(weak-on)/T(off)) may be greater than 1. In other words, the duration of the second time period (T(weak-on)) may be greater than the duration of the third time period (T(off)). Further, the ratio of the duration of the first time period to the duration of the third time period (T(hard-on)/T(off)) may be greater than 1 or less than 1. In other words, the duration of the first time period (T(hard-on)) may be greater than or less than the duration of the third time period (T(off)).

Figure 7E:
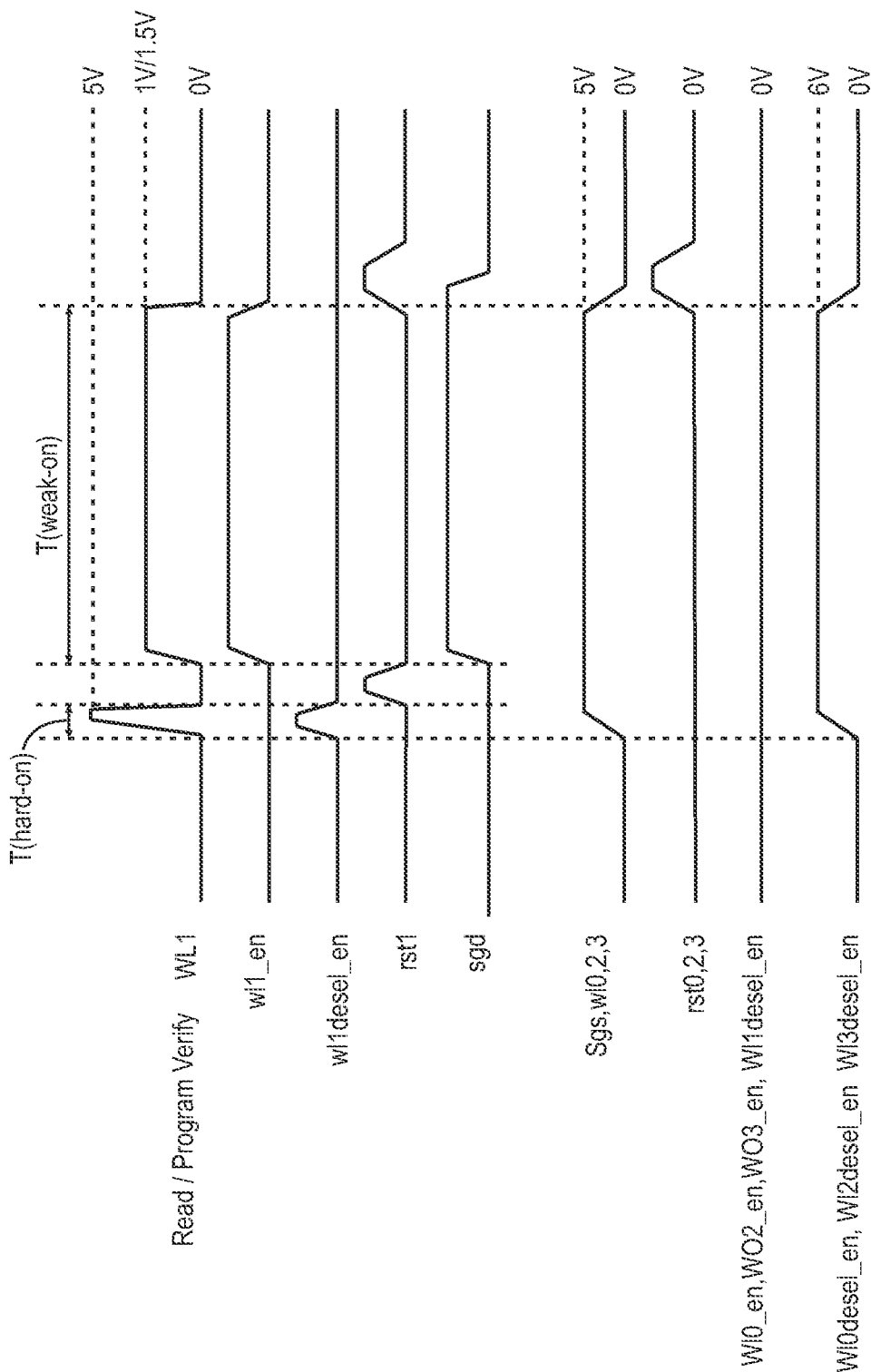
FIG. 7E is a timing diagram of operating the NAND flash memory in accordance with one or more embodiments of the present invention.

FIG. 7E is a timing diagram that illustrates signals in accordance with another embodiment of method of operating the regulator circuit 90. The diagram illustrates an embodiment wherein prior to a read operation (e.g., word line (WL1) is pulsed between 0V and 1V) or a verify operation (e.g., word line (WL1) is pulsed between 0V and 1.5V) a voltage spike (e.g., an excited pulse) is applied to the selected word line (WL1) to fill electrons in trap sites. In such embodiments, a trap site can be filled with electrons, and the subsequent read or program verify can be performed with the trap sites filled. For example, in the illustrated embodiment, a first period (T(hard-on)) includes the word line (WL1) being excited to a trap voltage level (5V) during a first time period (T(hard-on)), the voltage level transitions back to approximately 0V during a second time period, and the voltage level of the pulse transitions to read voltage level (1V) and/or the program verify voltage level (1.5V) during a third time period (T(weak-on)). The enable signal (wl1_en) is high during the third period (T(weak-on)), the deselect line (wl1desel_en) is high during the first period (T(hard-on)), the RST signal (rst1) is high during the second period, and the drain select line (SGD) transitions to a high state during the third period (T(weak-on)) and transitions back to a low state after the third period (T(weak-on)). Discharge may occur when the word line (WL1) is 1V or 1.5V and the gate signal (SGD) is high.

Figure 8:
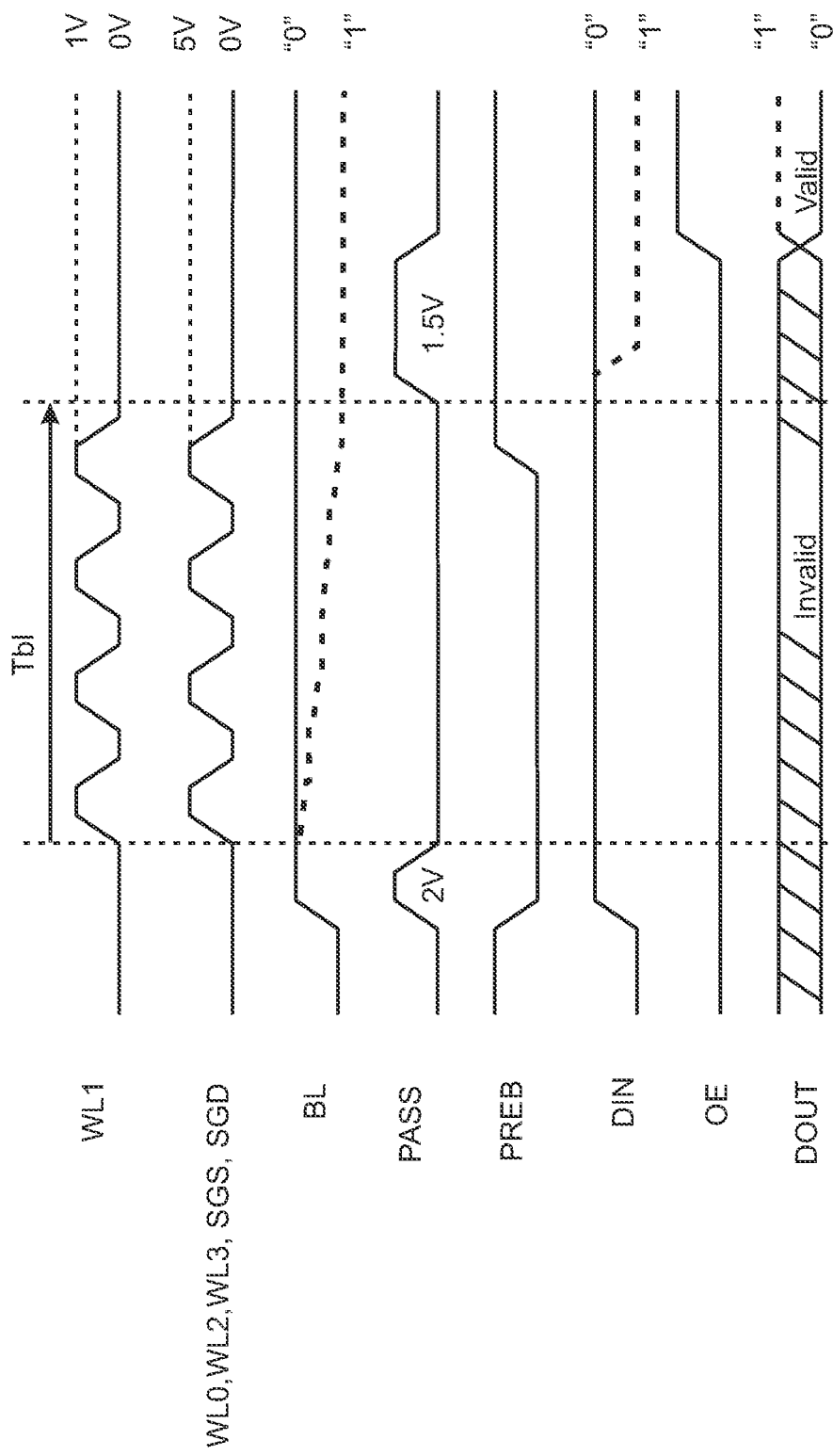
FIG. 8 is a timing diagram of operating the NAND flash memory in accordance with one or more embodiments of the present invention.

FIG. 8 is a timing diagram that illustrates signals in accordance with another embodiment of operating the memory device 30. The method includes providing a pulsed signal to the word line of the selected cell (WL1), as well as providing pulsed signals to other inputs of the column 70. For example, the word line signals to the unselected cells (WL0, WL2, and WL3) and the select signals (SGS and SGD) are pulsed. Similar to the embodiments discussed with regard to FIG. 7A, during the discharging period (Tb1), the word line to the selected cell (WL1) is pulsed between a low state, where the cell is off, and a high state, where the cell is on. For example, the high voltage level is about 1V and the low voltage level is about 0V. While the word line signal to the selected cell (WL1) is supplied with the low voltage level, the memory cell connected to the word line (WL1) is accumulated to detrap electrons that are trapped during the period where the word line signal to the selected cell (WL1) is at the high voltage level. Further, during the discharging period (Tb1), the word line signals to the unselected cells (WL0, WL2, and WL3) and the select signals (SGS and SGD) are pulsed between a low state, where the cells/transistors are on, and a high state, where the cells/transistors are off. In the illustrated embodiment, the high voltage level is about 5V and the low voltage level is about 0V. Each of the signals (WL0, WL2, WL3, SGS and SGD) can be generated via a regulator circuit that is the same or similar to the regulator circuit 90 discussed with to FIG. 7B.

Figure 9A:
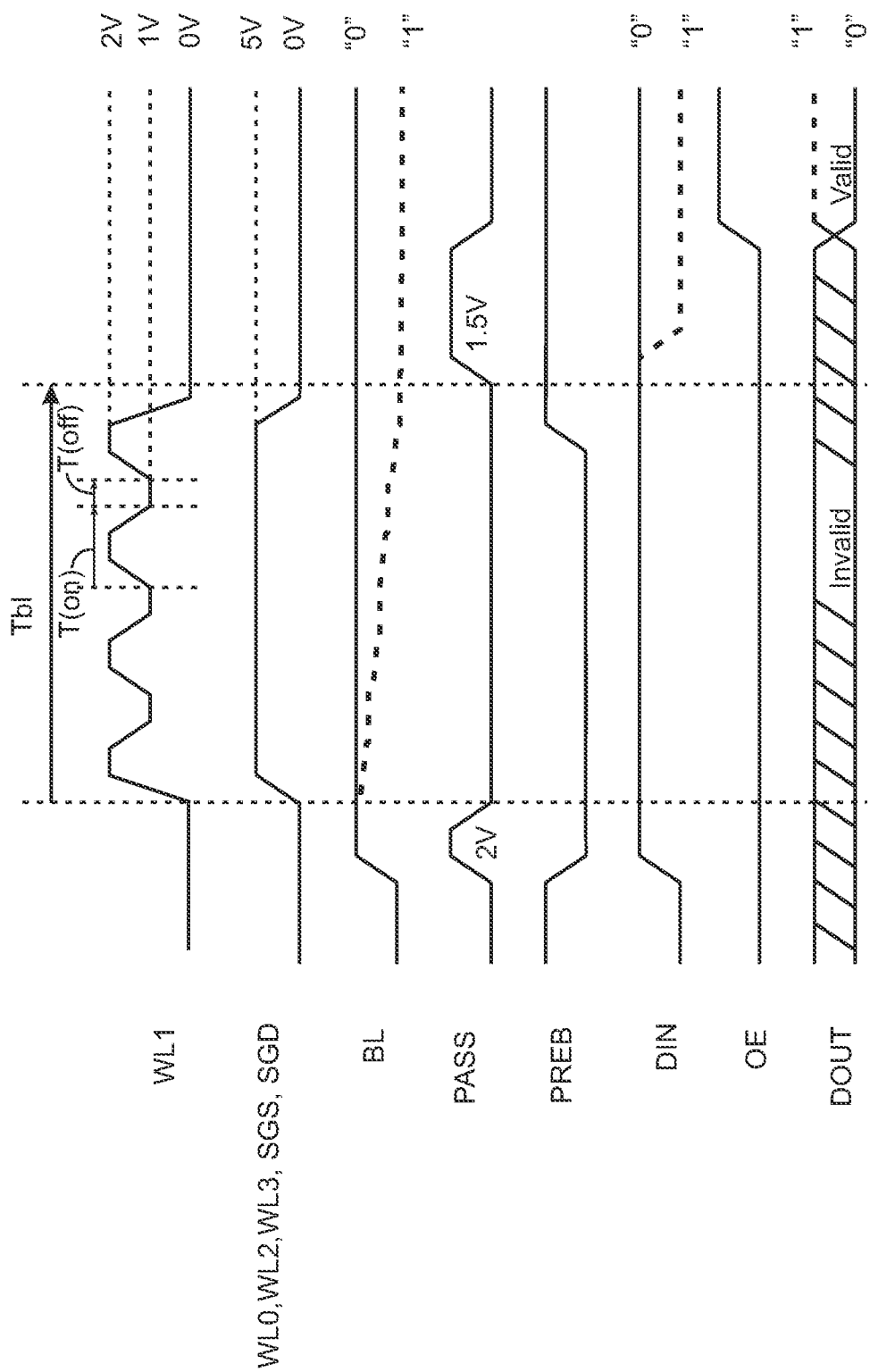
FIG. 9A is a timing diagram of operating the NAND flash memory in accordance with one or more embodiments of the present invention.

FIG. 9A is a timing diagram that illustrates signals in accordance with another embodiment of operating the memory device 30. The method includes a read operation that may detect whether the threshold voltage (Vt) of the selected cell is lower than a high voltage level or higher than a low voltage level. In other words, the read operation determines whether the threshold voltage (Vt) of the selected cell falls within a given voltage range. The method includes providing a pulsed (e.g., sequentially biased) signal (WL1) to the selected cell. The signal is driven from a low state and is pulsed between a first high voltage level and a second high voltage level. For example, during the discharging period (Tb1), the pulsed word line signal to the selected cell (WL1) alternates between a first high voltage level of about 2V and a second high voltage level of about 1V. While the word line signal to the selected cell (WL1) is supplied with the low voltage level, the memory cell connected to the word line (WL1) gets accumulated to detrap electrons that are trapped during the period where the word line signal to the selected cell (WL1) is at the high voltage level. As mentioned previously, the method enables the memory device 30 to detect whether the threshold voltage (Vt) of the selected cell is below the first high voltage level (2V) and/or higher than the second high voltage level (1V). The other signals operate similar to those discussed above with regard to FIGS. 6 and 7A. For example, the word line to the unselected cells (WL0, WL2, and WL3) and the select gate signals (SGS and SGD) are driven to a high voltage level, such as 5V, and are not pulsed (i.e., they are held at a constant voltage level). Further, the discharging period (Tb1) is extended such that the word line signal to the selected cell (WL1) is in the high state for a total time that is approximately equal to the time period that the word line (WL1) is held high in an embodiment where the word line (WL1) is not being pulsed.

Further, it is noted that the wordline (WL1) is pulsed during a first time period (T(on)) and maintained in a low state during a second period (T(off)) that occurs between each of the pulses. In the illustrated embodiment the ratio of the duration of the first period to the duration of the second period (T(on)/T(off)) may be greater than 1. In other words, the duration of the first period (T(on)) may be greater than the duration of the second period (T(off)).

Figure 9B:
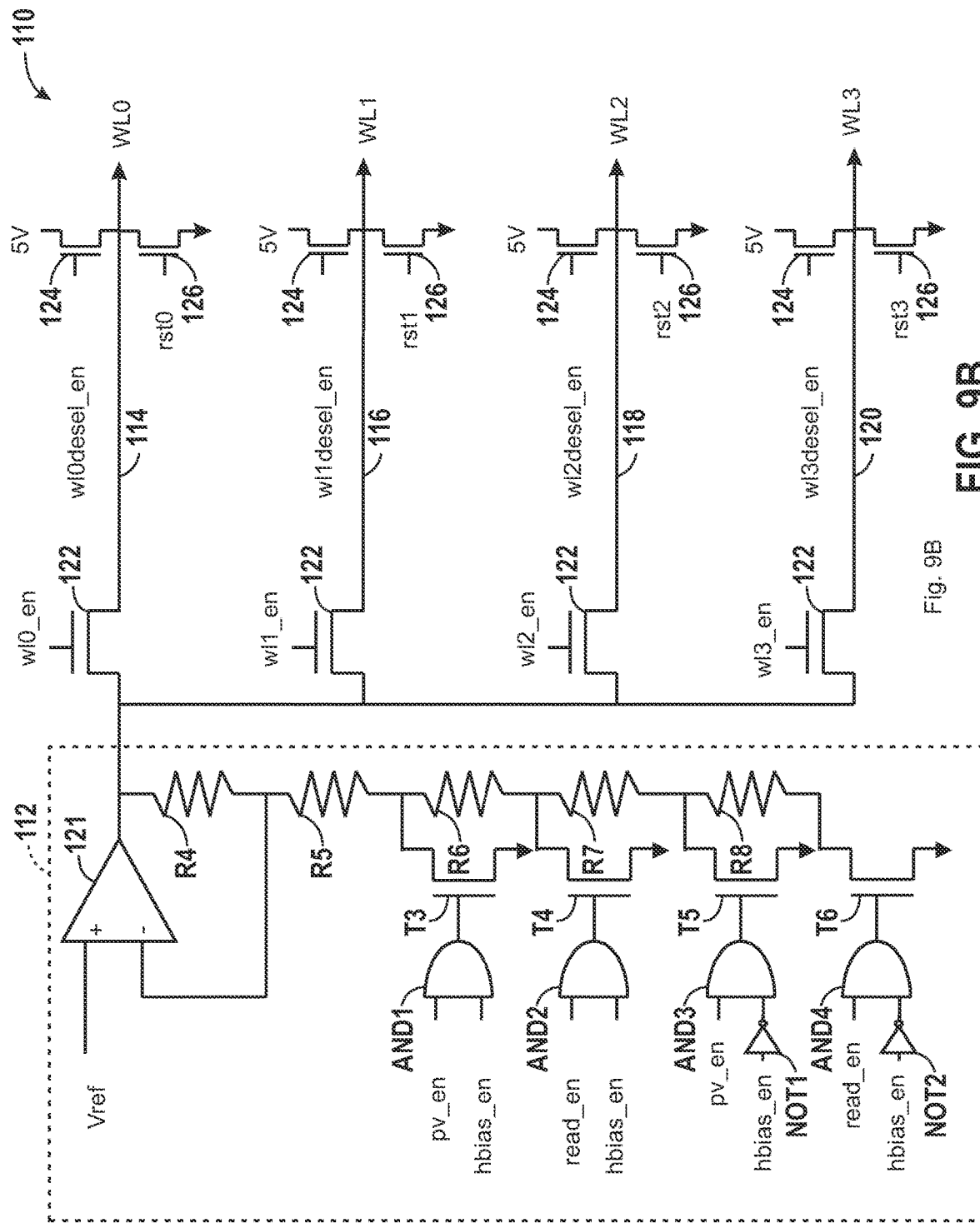
FIG. 9B is a schematic diagram of a regulator circuit in accordance with one or more embodiments of the present invention.

FIG. 9B is a schematic diagram of a regulator circuit 110 that may provide voltages to the various lines of the column 70, in accordance with the techniques discussed with regard to FIG. 9A. Specifically, the regulator circuit 110 may output a pulsed signal to a selected word line and output constant voltages to unselected word lines. The pulsed signal alternates between a first high voltage level and a second high voltage level (e.g., between 2V and 1V). The regulator circuit 110 includes a voltage input circuit 112 having a high-bias enable input (hbias_en) and an output coupled in parallel to outputs 114, 116, 118, and 120. In the illustrated embodiment, the voltage input circuit 112 includes a comparator 121, five resistors R4, R5, R6, R7, and R8, four AND logic gates AND1, AND2, AND3, and AND4, two inverters NOT1 and NOT2, and four transistors T3, T4, T5, and T6.

A reference voltage (Vref) is input to one node of the comparator 93. Control signals program verify enable (pv_en), bias enable (hbias_en), and read enable (read_en) are coupled to the inputs of the AND logic gates AND1, AND2, AND3, and AND4 and the inverters NOT1 and NOT2, as depicted. Outputs of the four AND logic gates AND1, AND2, AND3, and AND4 are coupled to the control gate of the four transistors T3, T4, T5, and T6, respectively. The outputs 114, 116, 118, and 120 are coupled to the word lines WL0, WL1, WL2, and WL3, respectively. Each of the outputs 114, 116, 118, and 120 includes an enable transistor 122, a deselect transistor 124, and a reset transistor (RST) 126. Enable signals (wl0_en, wl1_en, wl2_en, and wl3_en) are input to control gates of the enable transistors 122 on the outputs 114, 116, 118, and 120, respectively. Disable signals (wl0desel_en, wl1desel_en, wl2desel_en, and wl3desel_en) are input to control the gate of the deselect transistor 124 of the outputs 114, 116, 118, and 120, respectively. RST signals (rst0, rst1, rst2, and rst3) are input to the control gate of the reset transistor (RST) 126 of the outputs 114, 116, 118, and 120, respectively.

Figure 9C:
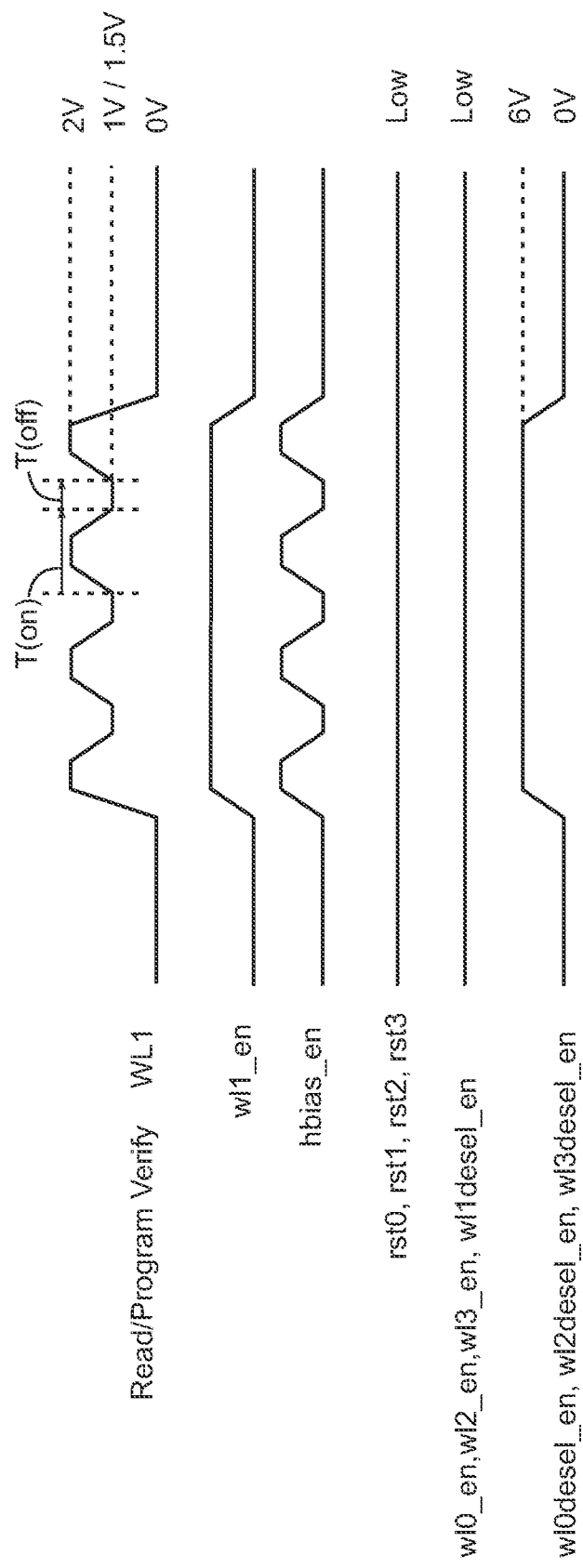
FIG. 9C is a timing diagram of operating the NAND flash memory in accordance with one or more embodiments of the present invention.

FIG. 9C is a timing diagram that illustrates signals in accordance with an embodiment of operating the regulator circuit 110 of FIG. 9B. The diagram illustrates an embodiments of a read operation (e.g., an operation where WL1 is pulsed between 2V and 1V) and/or verify operation (e.g., an operation where WL1 is pulsed between 2V and 1.5V) where the output 116 is coupled to the selected cell via the word line WL1. The word line of the selected cell (WL1) is pulsed as discussed above with regard to FIG. 9A. The enable signal (wl1_en) is driven to a high state/voltage level and is held constant while the word line of the selected cell (WL1) is pulsed. The high-bias enable input (hbias_en) is pulsed between a high voltage level and a low voltage level, with a profile similar to that of the word line of the selected cell (WL1). The RST signals (rst0, rst1, rst2, and rst3), the enable signals of the unselected word line/outputs (wl0_en, wl2_en, and wl3_en), and the disable signal (wl1_desel_en) of the selected word line/outputs remain at a low voltage/state during the period when the word line of the selected cell (WL1) is pulsed. The disable signals (wl0desel_en, wl2desel_en, and wl3desel_en) of the unselected word line/outputs are driven high during the period when the world line of the selected cell (WL1) is pulsed. In one embodiment, when the word line capacitance is 10 pF, a read time is 50 us, the number of rise and falls (pulses) for the selected word line is 10, the average current is 2 uA ((10 pF×1 V)/(50 us×10)=2 uA, less than 1% of the total read current.

Once again, it is noted that the wordline (WL1) is pulsed during a first time period (T(on)) and maintained in a low state during a second period (T(off)) that occurs between each of the pulses. In the illustrated embodiment the ratio of the duration of the first period to the duration of the second period (T(on)/T(off)) may be greater than 1. In other words, the duration of the first period (T(on)) may be greater than the duration of the second period (T(off)).

Figure 9D:
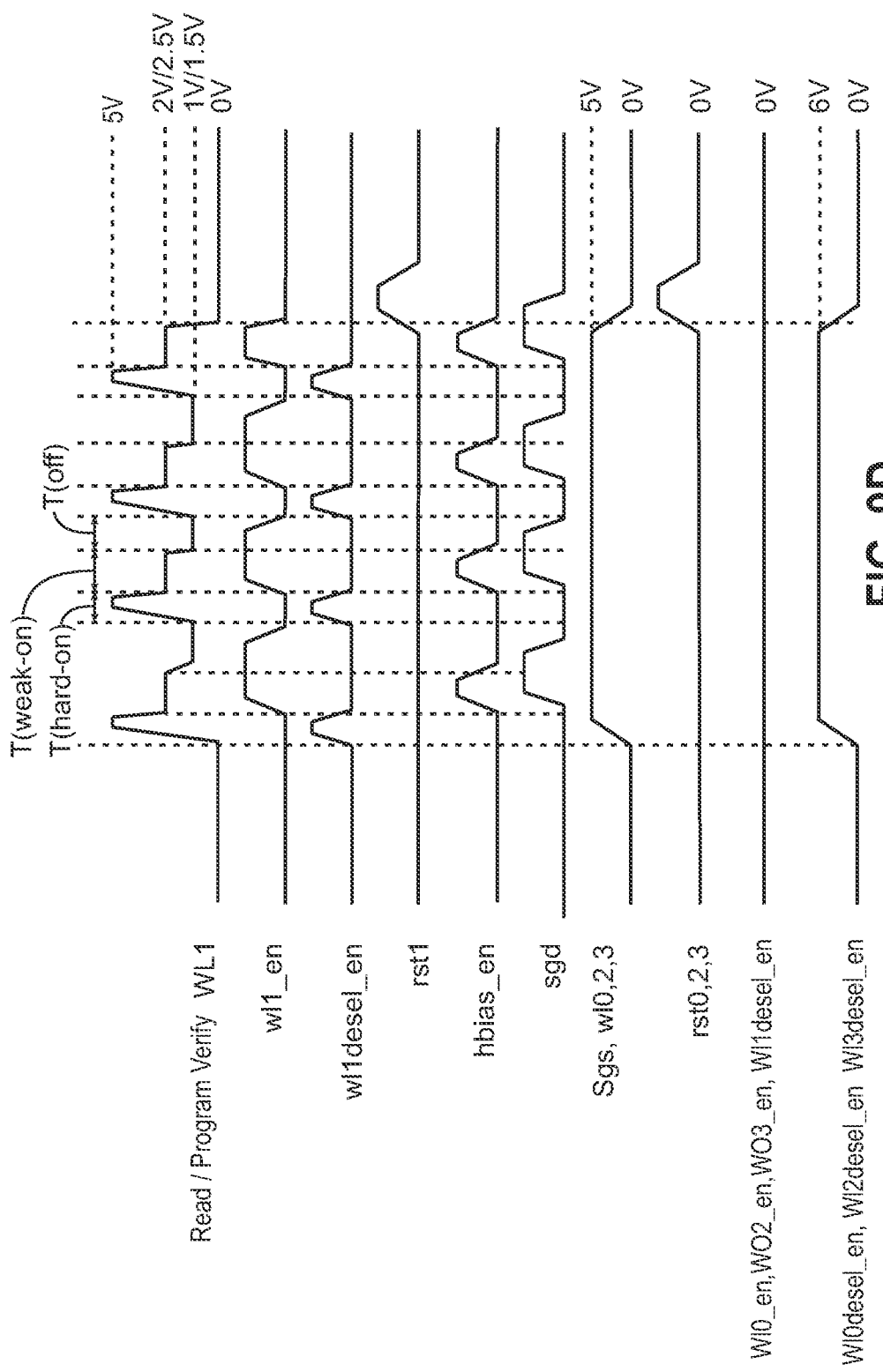
FIG. 9D is a timing diagram of operating the NAND flash memory in accordance with one or more embodiments of the present invention.

FIG. 9D is a timing diagram that illustrates signals in accordance with another embodiment of method of operating the regulator circuit 90. The diagram illustrates an embodiment including, a read operation (e.g., word line (WL1) is pulsed between 1V and 2V) and/or a verify operation (e.g., word line (WL1) is pulsed between 1.5V and 2.5V) and having an additional voltage spike (e.g., excited pulse) that occurs at the beginning of the high state of the pulse. In such embodiments, a trap site can be filled with electrons during the spike, and the subsequent read or program verify can be performed with the trap sites filled.

In the illustrated embodiment, the signals are controlled in a similar manner as to those discussed with regard to FIG. 9C. However, the word line (WL1) includes a multi-level pulse that first transitions to a trap voltage level, and returns to the high voltage level before returning to the low voltage level (e.g., above 0V) between the pulses. For example, in the illustrated embodiment, the pulses of the word line (WL1) transition from 0V or the low voltage level (1V or 1.5V) to the trap voltage level (5V) during a first time period (T(hard-on)) (during which the trap sites may be filled with electrons), the voltage level of the pulse transitions back to the high level (2V or 2.5V) of the read or verify voltage pulse during a second period (T(weak-on)), and voltage level transitions back to the low voltage level (1V or 1.5V) of the read or verify voltage pulse (e.g., the voltage level between the pulses) during a third period (T(off)).

The enable signal (wl1_en) is low during the first period (T(hard-on), transitions to high during the second period (T(weak-on) and transitions back low during the third period (T(off)). The deselect line (wl1desel_en) is high during the first period (T(hard-on)) and is low during the second period (T(weak-on)) and the third period (T(off)). The RST signal (rst1) transitions to high after the series of pulses (e.g., when the word line (WL1) returns to 0V). The high-bias enable input (hbias_en) is high during the second period (T(weak-on). The drain select line (SGD) transitions to a high state during the second period (T(weak-on)) and transitions back to a low state during the third period (T(off)). The drain select line (SGD) transitions to a high state after the deselect line (wl1desel_en) goes low, and the drain select line (SGD) transitions to a low state before the deselect line (wl1desel_en) goes high. Discharge may occur when the word line (WL1) is 2V or 2.5V and the gate signal (SGD) is high.

It is also noted that in the illustrated embodiment the ratio of the duration of the second time period to the duration of the third time period (T(weak-on)/T(off)) may be greater than 1. In other words, the duration of the second time period (T(weak-on)) may be greater than the duration of the third time period (T(off)). Further, the ratio of the duration of the first time period to the duration of the third time period (T(hard-on)/T(off)) may be greater than 1 or less than 1. In other words, the duration of the first time period (T(hard-on)) may be greater than or less than the duration of the third time period (T(off)).

Figure 10:
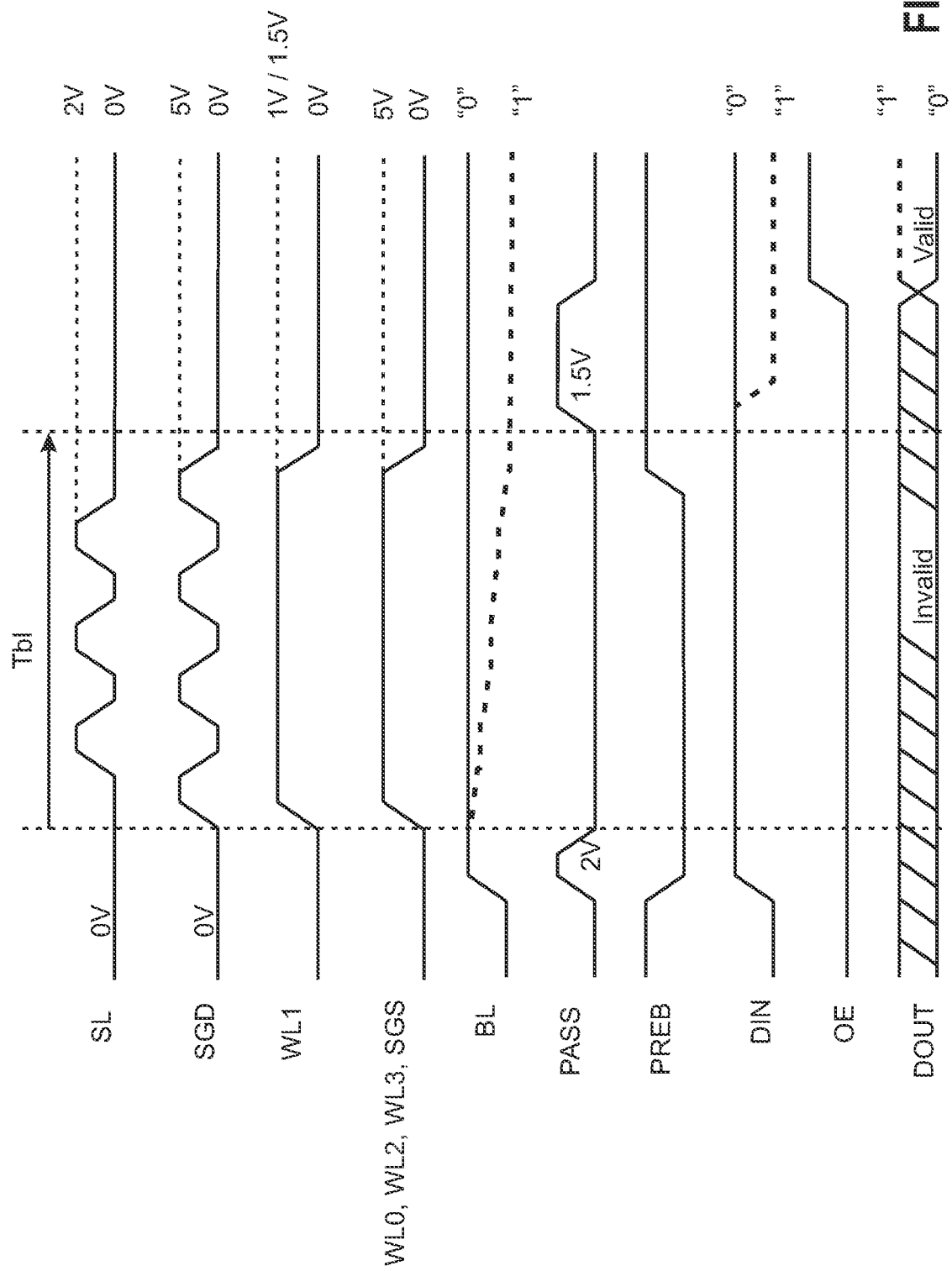
FIG. 10 is a timing diagram of operating the NAND flash memory in accordance with one or more embodiments of the present invention.

FIG. 10 is a timing diagram that illustrates another embodiment of a method of operating the memory device 30, in accordance with the present techniques. The method includes providing a constant voltage to the selected cell, and pulsing other signals coupled to the column 70. Specifically, the embodiment includes pulsing the source-line (SL) and the drain-select line (SGD), while the voltage level of the signals to the cells 72 (WL0, WL1, WL2, and WL3) and the signal to the source select gate transistor 78 (SGS) remain at a constant voltage level. During the discharging period (Tb1) the source line (SL) is pulsed between a low state and a high state and the drain-select line (SGD) is pulsed between a high state when the source line (SL) is low and a low state when the source line (SL) is high. For example, in the illustrated embodiment, the source line (SL) alternates between a low voltage level of about 0V and a high voltage level of about 2V, and the source-line (SL) alternates between a low voltage level of 0V and a high voltage level of 5V. The source-line (SL) and the drain select line (SGD) are pulsed between high and low states during the period when the word lines (WL0, WL1, WL2, and WL3) and the source select line (SGS) are driven to a high state. For example, the word line of the selected cell (WL1) is driven to 1.0V during a read operation or 1.5V during a verify operation, and the remaining word lines to the unselected cells (WL0, WL2, and WL3) and to the source select line (SGS) are driven to 5V. During the period when the source line (SL) is driven high (e.g., to 2V), the cells connected to the word line of the selected cell (WL1) are accumulated to detrap electrons that are trapped in cell. It is again noted, that the discharging period (Tb1) is extended for a period such that the word line signal of the selected cell (WL1) is in the high state for a total time that is approximately equal to the time period that the word line (WL1) is held high in an embodiment where the word line (WL1) is not being pulsed (e.g., the time period Tb1 of FIG. 6). In one embodiment, when the source line (SL) and the drain select line (SGD) capacitance are 1 nanofarad (nF) and 10 pF, respectively, a read time is 50 us, the number of rise and falls (pulses) for the selected word line is 10, the current efficiency of a 5V generation charge pump circuit is 20%, the average current is 500 uA ((1 nF×2V+(10 pF×5V)/2)/(50 us×10)=2 uA, approximately 10% of the total read current.

Although the previous embodiments are discussed in the context of a NAND flash memory device 30, the systems and methods can be applied to other types of memory where stored data is read by cell current as well. FIGS. 11A-11E include schematic diagrams of other memory devices that may employ techniques similar to those discussed above. For example, FIG. 11A illustrates a NOR flash memory cell 130. The NOR flash memory cell 130 includes a transistor 131 coupled between a bit line (BL) and a source line (SL) of a memory array, and a control gate of the transistor 131 coupled to a word line (WL) of the memory array. FIG. 11B illustrates a static random access memory (SRAM) cell 132. The SRAM cell 132 includes two cross-coupled inverters 134 and 136 and two access transistors 138 and 140. A control gate of each of the transistors 138 and 140 is coupled to a word line (WL) of a memory array. Further, the source and drain nodes of the access transistors 138 and 140 are coupled between the cross-coupled inverters 134 and 136 and complementary bit lines BL and/BL of the memory array. FIG. 11C illustrates a floating body cell 142. The floating body cell 142 includes a transistor 144 coupled between a bit line (BL) and a source line (SL) of a memory array, and a control gate of the transistor 144 coupled to the word line (WL) of the memory array. FIG. 11D illustrates a phase change memory cell 146. The phase change memory cell 146 includes a transistor 148 coupled between a bit line (BL) and a source line (SL) of a memory array, and a phase change material 150 disposed between a drain node of the transistor 148 and the bit line (BL) of the memory array. Further, a control gate of the transistor 148 is coupled to a word line (WL) of the memory array. FIG. 11E illustrates a magnetoresistive random access memory (MRAM) cell 152. The MRAM cell 152 includes a transistor 154 coupled between a bit line (BL) and a source line (SL) of a memory array, and a magnetic material 156 disposed between a drain node of the transistor 154 and the bit line (BL) of the memory array. Further, a control gate of the transistor 154 is coupled to a word line (WL) of the memory array.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A flash memory device comprising:
a floating gate memory array comprising a plurality of memory cells configured to store respective data values;
regulating circuitry configured to provide a pulsed wordline signal to a wordline of a memory cell of the plurality of memory cells during a read operation of the memory cell, wherein the pulsed wordline signal varies between a high voltage state and a low voltage state, such that electrons that trap during the high voltage state detrap during the low voltage state; and
sense circuitry configured to integrate a current of a bitline of the memory cell during the read operation and determine a data value of the memory cell based on integration of the current.

2. The flash memory device of claim 1, wherein the high voltage state is a first high voltage state and the pulsed wordline signal comprises a second high voltage state greater than the first high voltage state, and wherein the pulsed wordline signal varies between the second high voltage state, the first high voltage state, and the low voltage state.

3. The flash memory device of claim 2, wherein the pulsed wordline signal cycles, in order and at least twice, from the second high voltage state, to the first high voltage state, and to the low voltage state during a discharge period of the read operation.

4. The flash memory device of claim 1, wherein the memory cell is a first memory cell and the wordline is a first wordline, and wherein a second wordline of a second memory cell is held constant during the read operation of the first memory cell.

5. The flash memory device of claim 1, wherein the low voltage state comprises a positive voltage less than the high voltage state.

6. The flash memory device of claim 5, wherein a first amount of time associated with the high voltage state of the pulsed wordline signal is greater than a second amount of time associated with the low voltage state of the pulsed wordline signal.

7. The flash memory device of claim 1, comprising a data bus configured to transmit the data value from the flash memory device via the sense circuitry.

8. The flash memory device of claim 7, comprising an address decoder configured to direct access of the memory cell for the read operation in response to address information corresponding to the memory cell.

9. The flash memory device of claim 8, wherein the address decoder comprises a row decoder and a column decoder.

10. The flash memory device of claim 9, wherein the floating gate memory array comprises a NAND flash memory array.

11. A computing system comprising:
flash memory configured to store executable instructions via a floating gate memory array, wherein the flash memory comprises:
the floating gate memory array comprising a plurality of memory cells;
regulating circuitry configured to provide a pulsed wordline signal to a wordline of a memory cell of the plurality of memory cells during a read operation of the memory cell, wherein the pulsed wordline signal varies between a high voltage state and a low voltage state such that electrons that trap during the high voltage state detrap during the low voltage state; and
sense circuitry configured to determine a data value of the memory cell based on a bitline response of the memory cell;
one or more processors communicatively coupled to the flash memory via a data bus and configured to retrieve and execute the executable instructions to perform operations of the computing system; and
a power supply configured to supply power to the flash memory and the one or more processors.

12. The computing system of claim 11, wherein the sense circuitry comprises a sense amplifier configured to determine the data value of the memory cell by integrating a current of the bitline response while the regulating circuitry applies the pulsed wordline signal.

13. The computing system of claim 12, wherein the sense amplifier comprises a NOR flash memory sense amplifier, a static random access memory sense amplifier, a magnetoresistive random access memory sense amplifier, a floating body memory cell sense amplifier, or a phase change memory cell sense amplifier.

14. The computing system of claim 11, wherein the low voltage state comprises a ground reference voltage.

15. The computing system of claim 14, wherein the high voltage state is a first high voltage state and the pulsed wordline signal comprises a second high voltage state greater than the first high voltage state, and wherein the pulsed wordline signal cycles, in order, between the second high voltage state, the first high voltage state, and the low voltage state during a discharge period of the read operation.

16. The computing system of claim 11, wherein the memory cell is a first memory cell and the wordline is a first wordline, and wherein the regulating circuitry is configured to supply the pulsed wordline signal to a second wordline of a second memory cell during the read operation of the first memory cell.

17. The computing system of claim 11, wherein the pulsed wordline signal comprises at least two high voltage state pulses during a discharge period of the read operation.

18. The computing system of claim 11, wherein a first amount of time associated with the high voltage state of the pulsed wordline signal is greater than a second amount of time associated with the low voltage state of the pulsed wordline signal.

19. A memory device comprising:
a floating gate memory array comprising a plurality of memory cells configured to store respective data values;
an address decoder configured to direct access to a memory cell of the plurality of memory cells for a read operation or a verify operation in response to address information corresponding to the memory cell;
regulating circuitry configured to provide a time varying wordline signal to a wordline of the memory cell during a discharge period of the read operation of the memory cell or the discharge period of the verify operation of the memory cell, wherein the time varying wordline signal comprises a plurality of pulses, wherein each pulse of the plurality of pulses changes a voltage of the time varying wordline signal from a first voltage state to a second voltage state and returns the voltage to the first voltage state; and
sense circuitry configured to integrate a current response of a bitline of the memory cell during the discharge period and determine a data value of the memory cell based on integration of the current response.

20. The memory device of claim 19, wherein the floating gate memory array comprises a NAND flash memory array.

\* \* \* \* \*